(12) United States Patent
Cho et al.

(10) Patent No.: US 11,439,022 B2
(45) Date of Patent: Sep. 6, 2022

(54) PRINTED CIRCUIT BOARD

(71) Applicant: SAMSUNG ELECTRO-MECHANICS CO., LTD., Suwon-si (KR)

(72) Inventors: Young Il Cho, Suwon-si (KR); Yong Ho Baek, Suwon-si (KR); Sang Min Lee, Suwon-si (KR); Jae Min Choi, Suwon-si (KR); Tae Seong Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 115 days.

(21) Appl. No.: 16/842,490

(22) Filed: Apr. 7, 2020

(65) Prior Publication Data
US 2021/0068261 A1 Mar. 4, 2021

(30) Foreign Application Priority Data

Sep. 2, 2019 (KR) .................. 10-2019-0107980
Dec. 11, 2019 (KR) .................. 10-2019-0164683

(51) Int. Cl.
| | |
|---|---|
| *H05K 1/00* | (2006.01) |
| *H05K 1/18* | (2006.01) |
| *H05K 7/00* | (2006.01) |
| *H05K 1/11* | (2006.01) |
| *H05K 3/46* | (2006.01) |
| *H05K 1/02* | (2006.01) |

(52) U.S. Cl.
CPC .......... *H05K 1/188* (2013.01); *H05K 1/0298* (2013.01); *H05K 1/116* (2013.01); *H05K 1/184* (2013.01); *H05K 3/4679* (2013.01); *H05K 2201/037* (2013.01); *H05K 2201/0311* (2013.01)

(58) Field of Classification Search
CPC ...... H05K 1/188; H05K 1/0298; H05K 1/116; H05K 1/184; H05K 3/4679; H05K 2201/0311; H05K 2201/037
USPC ......................................... 361/748
See application file for complete search history.

(56) References Cited

U.S. PATENT DOCUMENTS

2011/0024172 A1\* 2/2011 Maruyama ........ H01L 23/49822
174/258
2013/0334703 A1 12/2013 Hondo et al.
(Continued)

FOREIGN PATENT DOCUMENTS

| JP | 2015-035497 A | 2/2015 |
|---|---|---|
| JP | 2017-076649 A | 4/2017 |

(Continued)

*Primary Examiner* — Andargie M Aychillhum
(74) *Attorney, Agent, or Firm* — Morgan, Lewis & Bockius LLP

(57) ABSTRACT

A printed circuit board includes a coreless substrate including an insulating body and a plurality of core wiring layers disposed on or within the insulating body, a build-up insulating layer covering at least a portion of each of an upper surface and a lower surface of the coreless substrate, and a build-up wiring layer disposed on at least one of an upper surface and a lower surface of the build-up insulating layer. A through-opening penetrates through the insulating body and is configured to receive an electronic component therein, and the first build-up insulating layer extends into the through-opening to embed the electronic component.

9 Claims, 26 Drawing Sheets

(56) References Cited

U.S. PATENT DOCUMENTS

| | | | | |
|---|---|---|---|---|
| 2014/0027165 | A1* | 1/2014 | Morita | H05K 1/024 |
| | | | | 174/258 |
| 2015/0043183 | A1 | 2/2015 | Ishiguro et al. | |
| 2015/0223341 | A1* | 8/2015 | Kim | H05K 1/185 |
| | | | | 361/761 |
| 2016/0374189 | A1* | 12/2016 | Lee | H05K 3/4602 |
| 2018/0130761 | A1* | 5/2018 | Kim | H01L 23/5389 |

FOREIGN PATENT DOCUMENTS

| | | |
|---|---|---|
| KR | 10-2013-0141372 A | 12/2013 |
| KR | 10-2016-0149984 A | 12/2016 |

* cited by examiner

PRINTED CIRCUIT BOARD

CROSS-REFERENCE TO RELATED APPLICATION(S)

This application claims the benefit under 35 USC 119(a) of Korean Patent Application No. 10-2019-0107980 filed on Sep. 2, 2019 and Korean Patent Application No. 10-2019-0164683 filed on Dec. 11, 2019 in the Korean Intellectual Property Office, the entire disclosures of which are incorporated herein by reference for all purposes.

BACKGROUND

1. Field

The present disclosure relates to a printed circuit board, and more particularly, to a printed circuit board in which an electronic component may be embedded.

2. Description of Related Art

Recently, electronic devices are getting thinner and providing more functionalities within a single package. Therefore, thinner and denser design rules are needed for substrates included in such devices. In accordance with such ultra high density and miniaturization, various types of substrate technologies are needed. In addition, there is demand for a substrate technology capable of embedding electronic components and securing sufficient rigidity and bending characteristics.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a printed circuit board able to have a relatively thin thickness and high wiring density and reducing warpage.

An aspect of the present disclosure is to provide a printed circuit board in which an electronic component may be easily embedded.

According to an aspect of the present disclosure, a coreless substrate formed using an insulating material able to handle warpage may be used as a core structure disposed in the center of a printed circuit board, a through-opening may be formed in the core structure to embed an electronic component therein, and wiring may be further designed by arranging an insulating material able to handle the formation of a high density circuit on both sides of the core structure in build-up form.

According to an aspect of the present disclosure, a printed circuit board includes a coreless substrate including an insulating body and a plurality of core wiring layers disposed on or within the insulating body, the coreless substrate having a through-opening penetrating through the insulating body. An electronic component is disposed in the through-opening, and a first build-up insulating layer covers at least a portion of two opposing surfaces of the coreless substrate, allowing at least a portion of the electronic component to be embedded in the first build-up insulating layer, and filling at least a portion of the through-portion. A first build-up wiring layer is disposed on an upper surface of the first build-up insulating layer, and a second build-up insulating layer is disposed on the upper surface of the first build-up insulating layer and covering at least a portion of the first build-up wiring layer. A second build-up wiring layer is disposed on an upper surface of the second build-up insulating layer. The insulating body includes a different type of material from a material of the second build-up insulating layer.

According to an aspect of the present disclosure, a printed circuit board includes a coreless substrate including a plurality of core insulating layers, a plurality of primer layers, and a plurality of core wiring layers. A build-up insulating layer covers at least respective portions of two opposing surfaces of the coreless substrate, and a build-up wiring layer is disposed on at least one surface of the build-up insulating layer. Each of the plurality of core insulating layers is thicker than each of the plurality of primer layers. At least one of the plurality of primer layers is disposed between the plurality of core insulating layers, and another of the plurality of primer layers is disposed between the build-up insulating layer and at least one of an uppermost core insulating layer or a lowermost core insulating layer among the plurality of core insulating layers.

According to a further aspect of the present disclosure, a printed circuit board includes a coreless substrate including a plurality of core insulating layers, a plurality of core wiring layers, and a plurality of core via layers each penetrating through a respective core insulating layer of the plurality of core insulating layers to connect two or more wiring layers of the plurality of core wiring layers. The coreless substrate has a through-opening penetrating therethrough from a first surface thereof to an opposing second surface thereof, the through-opening being configured for mounting of an electronic component therein. A build-up insulating layer covers at least respective portions of the first and second opposing surfaces of the coreless substrate, and a build-up wiring layer is disposed on at least one surface of the first and second opposing surfaces of the build-up insulating layer. The plurality of core insulating layers of the coreless substrate include a different type of material from a material of the build-up insulating layer, and the plurality of core via layers have profiles tapered in a same direction.

BRIEF DESCRIPTION OF THE DRAWINGS

The above and other aspects, features, and advantages of the present disclosure will be more clearly understood from the following detailed description, taken in conjunction with the accompanying drawings, in which.

DETAILED DESCRIPTION

Figure 1:
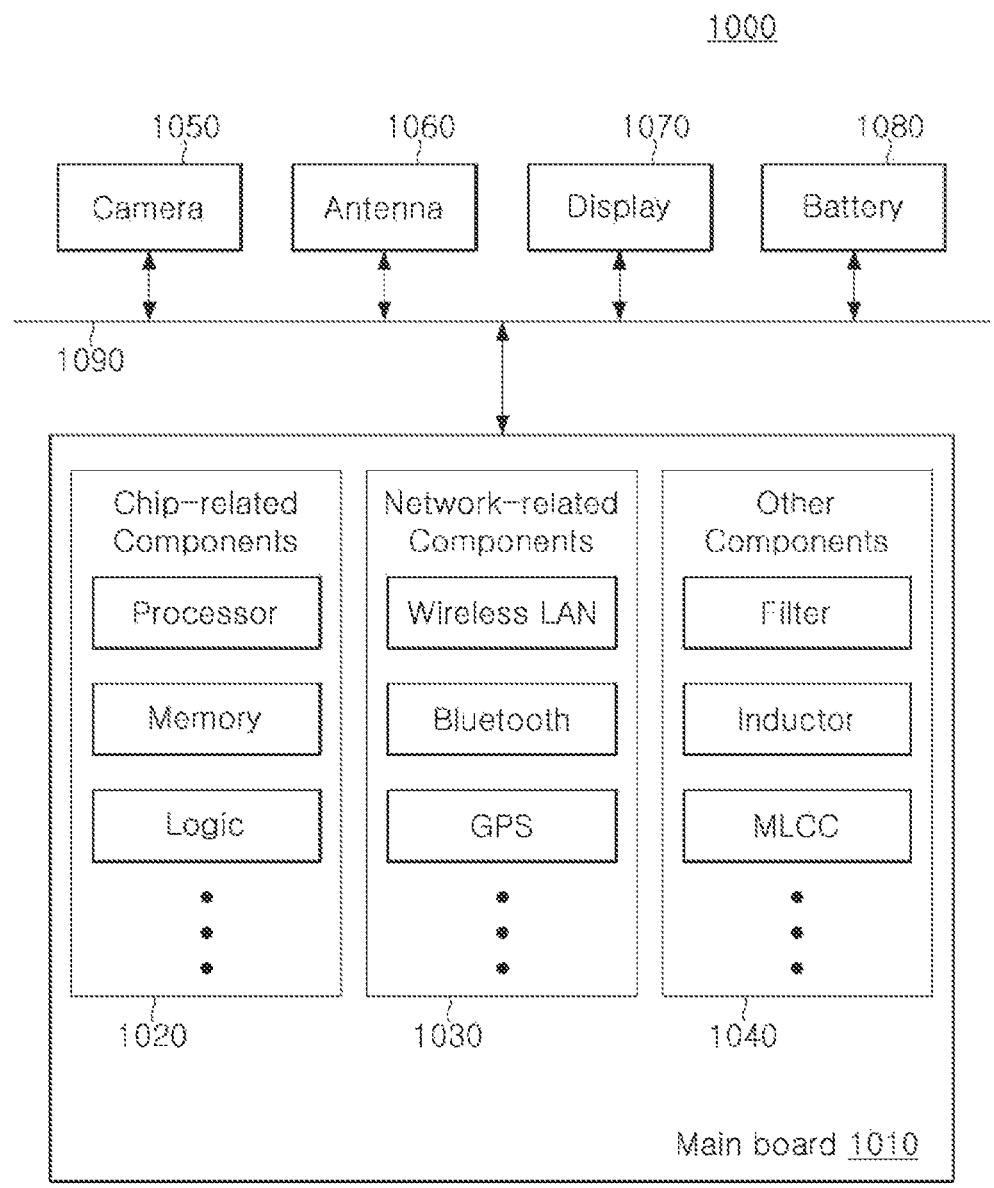
FIG. 1 is a schematic block diagram illustrating an example of an electronic device system.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The drawings may not be to scale, and the relative size, proportions, and depiction of elements in the drawings may be exaggerated for clarity, illustration, and convenience.

Subsequently, examples are described in further detail with reference to the accompanying drawings.

Electronic Device

FIG. 1 is a schematic block diagram illustrating an example of an electronic device system.

Referring to FIG. 1, an electronic device 1000 may accommodate a mainboard 1010 therein. The main board 1010 may include chip related components 1020, network related components 1030, other components 1040, and the like, physically or electrically connected thereto. These components may be connected to other electronic components to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter (ADC), an application-specific integrated circuit (ASIC), or the like. However, the chip related components 1020 are not limited thereto, but may also include other types of chip related components. In addition, the electronic components 1020 may be combined with each other. The chip related component 1020 may be in the form of a package including the above-described chip or electronic component.

The network related components 1030 may include components compatible with and/or implementing various protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access + (HSPA+), high speed downlink packet access + (HSDPA+), high speed uplink packet access + (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include components compatible with a variety of other wireless or wired standards or protocols. In addition, the network related components 1030 may be combined with each other, together with the chip related electronic components 1020 described above.

Other components 1040 may include a high frequency inductor, a ferrite inductor, a power inductor, a ferrite bead, a low temperature co-fired ceramic (LTCC), an electro magnetic interference (EMI) filter, a multilayer ceramic condenser (MLCC), and the like. However, other components 1040 are not limited thereto, and may also include passive components in the form of chip components used for various other uses, or the like.

Depending on a type of the electronic device 1000, the electronic device 1000 may include other components that may or may not be physically or electrically connected to the mainboard 1010. These other components may include, for example, a camera module 1050, an antenna module 1060, a display device 1070, a battery 1080 and the like, but are not limited thereto. For example, these other components may also include an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. In addition, other electronic components used for various uses depending on a type of electronic device 1000, or the like may be used.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
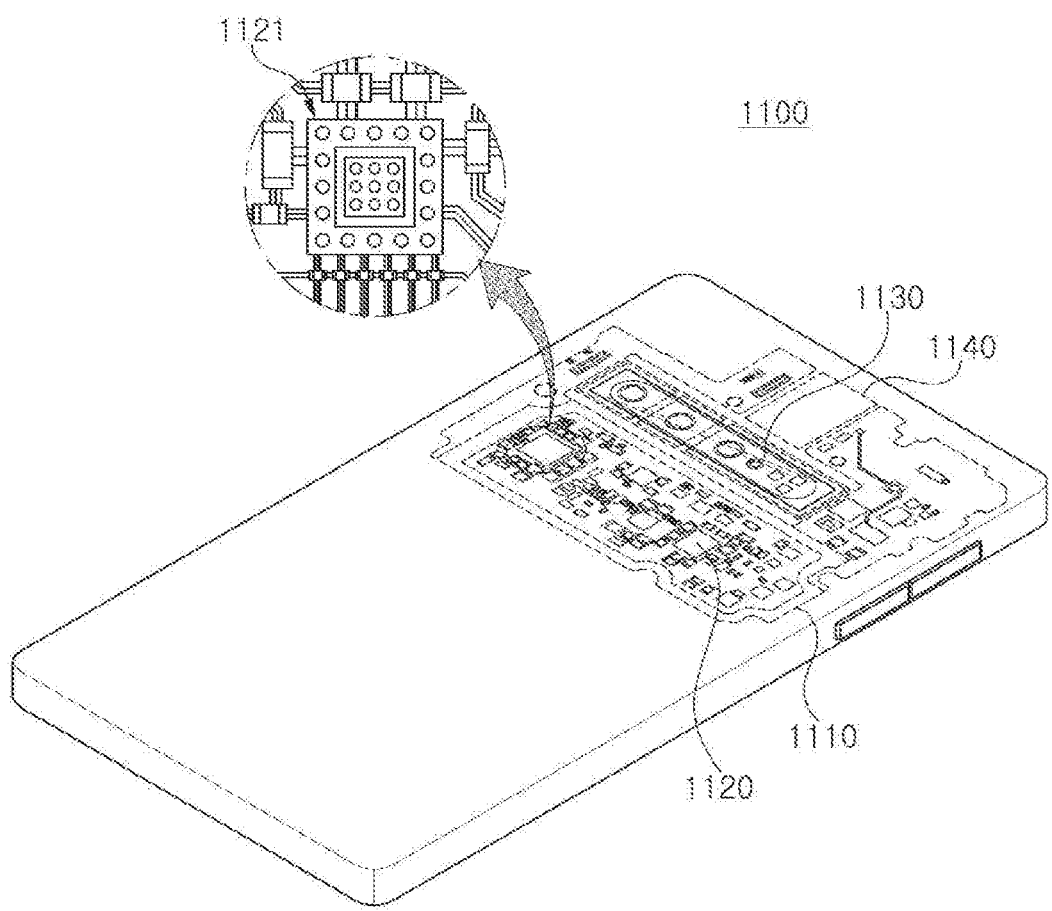
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A mainboard 1110 may be accommodated in the smartphone 1100, and various electronic components 1120 may be physically or electrically connected to the mainboard 1110. In addition, other electronic components that may or may not be physically or electrically connected to the mainboard 1110, such as a camera module 1130 and/or a speaker 1140, may be accommodated therein. Some of the electronic components 1120 may be chip related components, for example, a semiconductor package 1121, but are not limited thereto. The semiconductor package 1121 may be a package substrate in the form of a printed circuit board in which electronic components including active components and/or passive components are embedded. Alternatively, the semiconductor package 1121 may have the form in which an electronic component including an active component and/or a passive component is further surface-mounted on such a package substrate. On the other hand, the electronic device is not necessarily limited to the smartphone 1100, and may be another electronic device as described above.

Printed Circuit Board

Figure 3:
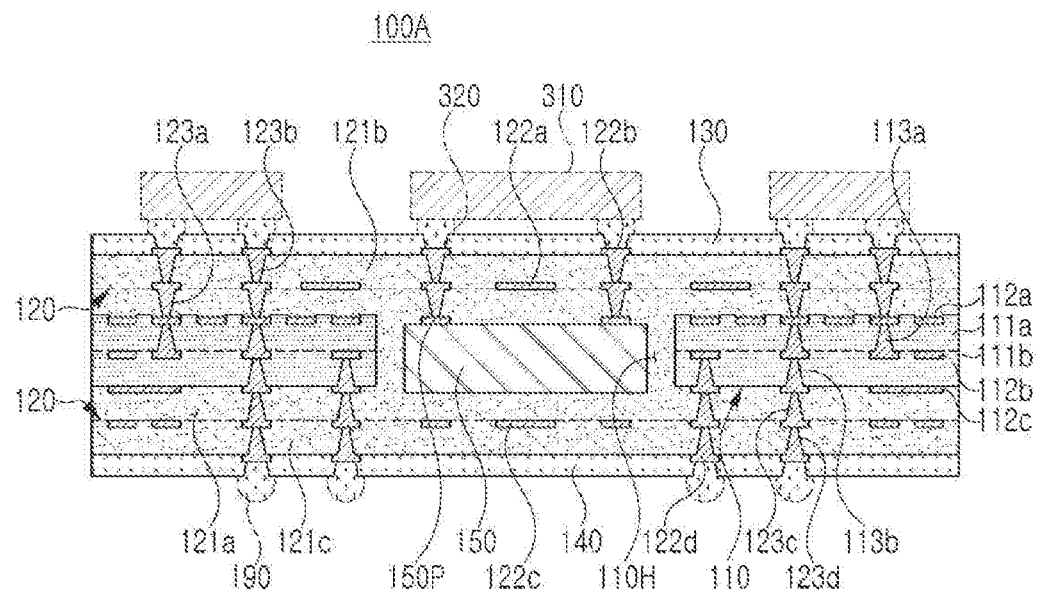
FIG. 3 is a cross-sectional view schematically illustrating an example of a printed circuit board.

FIG. 3 is a cross-sectional view schematically illustrating an example of a printed circuit board.

Referring to FIG. 3, a printed circuit board 100A according to an example includes a core structure 110 and build-up structures 120 disposed on and below the core structure 110. If desired, the printed circuit board 100A according to an example may further include first and second passivation layers 130 and 140 disposed on the upper side and the lower side of the build-up structure 120, respectively.

The core structure 110 includes a first core insulating layer 111a, a first core wiring layer 112a embedded in the first core insulating layer 111a and having an upper surface exposed from an upper surface of the first core insulating layer 111a, a second core wiring layer 112b protrudingly disposed on a lower surface of the first core insulating layer 111a, a first core via layer 113a penetrating through the first core insulating layer 111a and connecting the first and second core wiring layers 112a and 112b, a second core insulating layer 111b disposed on the lower surface of the first core insulating layer 111a and covering the second core wiring layer 112b, a third core wiring layer 112c protrudingly disposed on a lower surface of the second core insulating layer 111b, and a second core via layer 113b penetrating through the second core insulating layer 111b and connecting the second and third core wiring layers 112b and 112c. The core structure 110 has a coreless substrate structure. In this case, the coreless substrate structure refers to a substrate structure manufactured through a coreless process using a detach carrier film as described below. For example, the coreless substrate structure may be a structure in which the coreless substrate structure does not include a core layer that is thicker than other insulating layers and that has superior rigidity than other insulating layers.

The build-up structure 120 includes a first build-up insulating layer 121a covering the upper and lower surfaces of the core structure 110, a first build-up wiring layer 122a protrudingly disposed on an upper surface of the first build-up insulating layer 121a, a first build-up via layer 123a penetrating through the first build-up insulating layer 121a and connecting the first core wiring layer 112a and the first build-up wiring layer 122a, a second build-up insulating layer 121b disposed on an upper surface of the first build-up insulating layer 121a to cover the first build-up wiring layer 122a, a second build-up wiring layer 122b protrudingly disposed on an upper surface of the second build-up insulating layer 121b, a second build-up via layer 123b penetrating through the second build-up insulating layer 121b and connecting the first and second build-up wiring layers 122a and 122b, a third build-up wiring layer 122c protrudingly disposed on a lower surface of the first build-up insulating layer 121a, a third build-up via layer 123c penetrating through the first build-up insulating layer 121a and connecting the third core wiring layer 112c and the third build-up wiring layer 122c, a third build-up insulating layer 121c disposed on the lower surface of the first build-up insulating layer 121a to cover the third build-up wiring layer 122c, a fourth build-up wiring layer 122d protruding from a lower surface of the third build-up insulating layer 121c, and a fourth build-up via layer 123d penetrating through the third build-up insulating layer 121c and connecting the third and fourth build-up wiring layers 122c and 122d.

The first and second core via layers 113a and 113b may respectively include connection vias having profiles tapered in the same direction. For example, the first and second core via layers 113a and 113b may each include tapered connection vias having an upper width narrower than a lower width on a cross section. Thereby, it can be seen that the core structure 110 has a structure of a coreless substrate that does not include a separate core layer. In addition, the first and second build-up via layers 123a and 123b may include connection vias having profiles tapered in the same direction. In addition, the third and fourth build-up via layers 123c and 123d may include connection vias having profiles tapered in the same direction. In addition, the connection vias of the first and second build-up via layers 123a and 123b and the connection vias of the third and fourth build-up via layers 123c and 123d may have profiles tapered in directions opposite to each other with the core structure 110 interposed therebetween. For example, the first and second build-up via layers 123a and 123b may each include tapered connection vias having an upper width larger than a lower width in a cross section. In addition, the third and fourth build-up via layers 123c and 123d may each include tapered connection vias having an upper width narrower than a lower width in a cross section. Thereby, it can be seen that the build-up structure 120 has a structure that is built up on upper and lower sides with the core structure 110 at the center.

On the other hand, the first and second core insulating layers 111a and 111b and the first to third build-up insulating layers 121a, 121b and 121c may include different types of materials. For example, the elastic modulus of the first and second core insulating layers 111a and 111b may be greater than that of the first to third build-up insulating layers 121a, 121b and 121c. For example, the rigidity of the first and second core insulating layers 111a and 111b may be relatively elevated relative to that of the first to third build-up insulating layers 121a, 121b and 121c. Thereby, even when the core structure 110 has a structure of a coreless substrate, it may be effective in reducing warpage. Byway of example without limitation, the material of the first and second core insulating layers 111a and 111b may be a material including an insulating resin, an inorganic filler, and glass fiber (Glass Cloth, Glass Fabric), for example, a prepreg. For example, an insulating body provided by the first and second core insulating layers 111a and 111b may include a prepreg. In addition, the material of the first to third build-up insulating layers 121a, 121b, and 121c may be a material including an insulating resin and an inorganic filler, such as Ajinomoto Build-up Film (ABF). For example, the build-up body provided by the first to third build-up insulating layers 121a, 121b and 121c may include an ABF. Through the use of this combination of materials, rigidity retention through the core structure 110 and a high-density wiring design through the build-up structure 120 may be further effectively obtained.

On the other hand, the core structure 110 may have an opening or through-portion 110H penetrating through the first and second core insulating layers 111a and 111b. An electronic component 150 may be disposed in the through-portion 110H. The first build-up insulating layer 121a may allow the electronic component 150 to be embedded therein and may fill the through-portion 110H. As described above, since the core structure 110 is a structure of a coreless substrate and may have the through-portion 110H, the electronic component 150 may be effectively embedded, while providing for a thickness reduction and a warpage reduction of the overall printed circuit board structure. Therefore, the printed circuit board 100A according to an example may be used as a component embedded substrate, and as described below, additional electronic components may be surface-mounted on the upper side, and an electrical connection metal bump 190 such as solder balls may be disposed on the lower side. Therefore, the printed circuit board may also be used as a package substrate such as a ball grid array (BGA).

As described above, the printed circuit board 100A according to an example may have a structure in which the core structure 110 in the form of a coreless substrate formed using an insulating material capable of coping with bending is disposed in the center thereof, and a build-up structure 120 formed using an insulating material that may correspond to the formation of a high-density circuit is disposed on both sides of the core structure 110. Thus, the printed circuit board 100A may cope with thin thickness and high wiring density and may reduce a warping problem. In addition, a through-portion may be formed in the core structure 110 to embed the electronic component 150 therein, and thus, a structure of the printed circuit board in which the electronic component 150 is easily embedded may be provided.

Hereinafter, the components of the printed circuit board 100A according to an example will be described in more detail with reference to the accompanying drawings.

The core structure 110 includes a first core insulating layer 111a, a first core wiring layer 112a buried in the first core insulating layer 111a and having an upper surface exposed from an upper surface of the first core insulating layer 111a, a second core wiring layer 112b protrudingly disposed on a lower surface of the first core insulating layer 111a, a first core via layer 113a penetrating through the first core insulating layer 111a and connecting the first and second core wiring layers 112a and 112b, a second core insulating layer 111b disposed on the lower surface of the first core insulating layer 111a and covering the second core wiring layer 112b, a third core wiring layer 112c protrudingly disposed on a lower surface of the second core insulating layer 111b, and a second core via layer 113b penetrating through the second core insulating layer 111b and connecting the second and third core wiring layers 112b and 112c. The core structure 110 includes both an embedded pattern first core wiring layer 112a and a protruding pattern third core wiring layer 112c. The core structure 110 may have the through-portion 110H, and the through-portion 110H may penetrate through the first and second core insulating layers 111a and 111b. In addition, the through-portion 110H may have a wall surface continuously provided through an inner side surface of an insulating body of the core structure 110 including the first and second core insulating layers 111a and 111b.

An insulating material may be used as the material of the first and second core insulating layers 111a and 111b, and the insulating material may be a thermosetting resin such as an epoxy resin, a thermoplastic resin such as polyimide, or a material including a reinforcing material such as an inorganic filler and/or glass fiber together with these resins, for example, a prepreg. The boundary between the first and second core insulating layers 111a and 111b may be clear, but may be unclear. The first and second core insulating layers 111a and 111b may include the same type of material. The thicknesses of the first and second core insulating layers 111a and 111b may be substantially the same. The thickness of each of the first and second core insulating layers 111a and 111b may be thinner than the thickness of a core layer insulating material of a copper clad laminate (CCL) or an unclad CCL commonly used for a cored substrate.

A metal material may be used as the material of the first to third core wiring layers 112a, 112b and 112c, and as the metal material, copper (Cu), aluminum (Al), silver (Ag), tin (Sn), gold (Au), nickel (Ni), lead (Pb), titanium (Ti), alloys thereof, or the like may be used. The first to third core wiring layers 112a, 112b, and 112c may perform various functions according to the design of the layer, and for example, may include a ground (GrouND) pattern, a power (PoWeR: PWR) pattern, a signal (S) pattern, and the like. In this case, the signal S pattern includes various signals except for a ground GND pattern, a power PWR pattern, and the like, for example, a data signal. These patterns may respectively include a line pattern, a plane pattern, and/or a pad pattern. The first to third core wiring layers 112a, 112b, and 112c may be formed by a plating process such as an additive process (AP), a semi AP (SAP), a modified SAP (MSAP), or a TT (Tenting), and as a result, may include a seed layer which is an electroless plating layer and an electrolytic plating layer formed based on the seed layer.

A metal material may be used as the material of the first and second core via layers 113a and 113b, and the metal material may be copper (Cu), aluminum (Al), silver (Ag), tin (Sn), gold (Au), nickel (Ni), lead (Pb), titanium (Ti), alloys thereof, or the like. The first and second core via layers 113a and 113b may also perform various functions according to the design of the layer, and for example, may include a connection via for signal connection, a connection via for ground connection, and a connection via for power connection. The first and second core via layers 113a and 113b may respectively include connection vias having tapered profiles in the same direction. For example, the first and second core via layers 113a and 113b may each include tapered connection vias having an upper width narrower than a lower width on a cross section. The connection vias of the first and second core via layers 113a and 113b may be completely filled with a metal material, respectively, or may be formed as the metal material is formed along the walls of the via holes. The connection vias of the first and second core via layers 113a and 113b may be in a stack via relationship with each other, or may be in a staggered via relationship. The first and second core via layers 113a and 113b may also be formed by a plating process, for example, a process such as AP, SAP, MSAP, TT, or the like, and as a result may include a seed layer, which is an electroless plating layer, and an electrolytic layer formed on the seed layer. The first core via layer 113a is formed at the same time as the second core wiring layer 112b by the same plating process, and may be integrated therewith without a boundary. The second core via layer 113b may be formed simultaneously with and in the same plating process as that of the third core wiring layer 112c, and may be integrated with each other without boundaries.

The build-up structure 120 includes a first build-up insulating layer 121a covering an upper surface and a lower surface of the core structure 110, a first build-up wiring layer 122a protrudingly disposed on an upper surface of the first build-up insulating layer 121a, a first build-up via layer 123a penetrating through the first build-up insulating layer 121a and connecting the first core wiring layer 112a and the first build-up wiring layer 122a, a second build-up insulating layer 121b disposed on an upper surface of the first build-up insulating layer 121a to cover the first build-up wiring layer 122a, a second build-up wiring layer 122b protrudingly disposed on an upper surface of the second build-up insulating layer 121b, a second build-up via layer 123b that penetrates the second build-up insulating layer 121b and connects the first and second build-up wiring layers 122a and 122b, a third build-up wiring layer 122c protrudingly disposed on a lower surface of the first build-up insulating layer 121a, a third build-up via layer 123c penetrating through the first build-up insulating layer 121a and connecting the third core wiring layer 112c and the third build-up wiring layer 122c, a third build-up insulating layer 121c disposed on the lower surface of the first build-up insulating layer 121a to cover the third build-up wiring layer 122c, a fourth build-up wiring layer 122d protrudingly disposed on a lower surface of the third build-up insulating layer 121c, and a fourth build-up via layer 123d penetrating through the third build-up insulating layer 121c and connecting the third and fourth build-up wiring layers 122c and 122d.

An insulating material may be used as a material of the first to third build-up insulating layers 121a, 121b and 121c, and the insulating material may be a thermosetting resin such as an epoxy resin, a thermoplastic resin such as polyimide, or a material including a reinforcing material such as an inorganic filler together with these resins, for example, ABF or the like. The first to third build-up insulating layers 121a, 121b, and 121c may include the same type of material. The boundary between the first to third build-up insulating layers 121a, 121b, and 121c may be clear or may be unclear. If desired, the first build-up insulating layer 121a may be formed of a plurality of layers. The thicknesses of the second and third build-up insulating layers 121b and 121c may be substantially the same as each other. The second and third build-up insulating layers 121b and 121c may be each formed of a plurality of layers, and in this case, the numbers of respective layers may be the same in terms of bending control. The first and second core insulating layers 111a and 111b and the first to third build-up insulating layers 121a, 121b and 121c may include different types of materials, and each of the first and second core insulating layers 111a and 111b may have a higher elastic modulus than that of each of the first to third build-up insulating layers 121a, 121b and 121c.

A metal material may be used as a material of the first to fourth build-up wiring layers 122a, 122b, 122c, and 122d, and in this case, as the metal material, copper (Cu), aluminum (Al), silver (Ag), tin (Sn), gold (Au), nickel (Ni), lead (Pb), titanium (Ti), alloys thereof, or the like may be used. The first to fourth build-up wiring layers 122a, 122b, 122c, and 122d may perform various functions according to the design of the layer, and for example, may include a ground (GND) pattern, a power (PWR) pattern, and a signal (S) pattern. In this case, the signal S pattern includes various signals except for a ground GND pattern, a power PWR pattern, and the like, for example, and may for example carry a data signal. These patterns may each include a line pattern, a plane pattern, and/or a pad pattern. The first to fourth build-up wiring layers 122a, 122b, 122c, and 122d may be formed by a plating process, for example, a process such as AP, SAP, MSAP, TT, or the like, and as a result, may include a seed layer which is an electroless plating layer, and an electrolytic layer formed based on the seed layer. The third and fourth build-up wiring layers 122c and 122d may be disposed in a larger number of layers depending on the number of layers of the second and third build-up insulating layers 121b and 121c, respectively.

A metal material may also be used as the material of the first to fourth build-up via layers 123a, 123b, 123c and 123d, and the metal material may be copper (Cu), aluminum (Al), silver (Ag), tin (Sn), gold (Au), nickel (Ni), lead (Pb), titanium (Ti), alloys thereof, or the like. The first to fourth build-up via layers 123a, 123b, 123c, and 123d may also perform various functions according to the design of the corresponding layer, and for example, may include a connection via for signal connection, a connection via for ground connection, and a connection via for power connection. The first and second build-up via layers 123a and 123b may each include connection vias having a profile tapered in the same direction, and the third and fourth build-up via layers 123c and 123d may each include connection vias having a profile tapered in the same direction. The connection vias of the first and second build-up via layers 123a and 123b and the connection vias of the third and fourth build-up via layers 123c and 123d may include profiles tapered in opposite directions, with the core structure 110 interposed therebetween. For example, the first and second build-up via layers 123a and 123b may each include tapered connection vias having an upper width larger than a lower width in a cross section. In addition, the third and fourth build-up via layers 123c and 123d may each include a tapered connection via having an upper width narrower than a lower width in a cross section. The connection vias of the first to fourth build-up via layers 123a, 123b, 123c, and 123d may be completely filled with a metal material, or may be formed as the metal material is formed along the walls of the via holes. The first to fourth build-up via layers 123a, 123b, 123c, and 123d may also be formed by a plating process, for example, an AP, SAP, MSAP, TT, or the like, and as a result, may include a seed layer which is an electroless plating layer, and an electrolytic layer formed based on the seed layer. The first to fourth build-up via layers 123a, 123b, 123c, and 123d are simultaneously formed in the same plating process as the first to fourth build-up wiring layers 112a, 112b, 112c, and 112d, respectively, and may be integrated with the first to fourth build-up wiring layers 112a, 112b, 112c and 112d, respectively, without any boundary therebetween. The third and fourth build-up via layers 123c and 123d may be disposed in a relatively larger number of layers depending on the number of layers of the second and third build-up insulating layers 121b and 121c, respectively. The connection vias of the first to third build-up via layers 123a, 123b and 123c may be in a stack via relationship with each other, or may be in a staggered via relationship.

The first and second passivation layers 130 and 140 may protect the internal configuration of the printed circuit board 100A from external physical and chemical damages. The first and second passivation layers 130 and 140 may include a thermosetting resin and an inorganic filler. For example, the first and second passivation layers 130 and 140 may be respectively ABF, but an example thereof is not limited thereto. Each of the first and second passivation layers 130 and 140 may be a known solder resist (SR) layer. In addition, if desired, the first and second passivation layers 130 and 140 may include a Photo Image-able Dielectric (PID). The first and second passivation layers 130 and 140 may include the same type of material, and may have substantially the same thickness as each other, but an example thereof is not limited thereto. The first and second passivation layers 130 and 140 may include different types of materials, and may have different thicknesses. Each of the first and second passivation layers 130 and 140 may have a plurality of openings, and the plurality of openings may expose at least portions of the respective second build-up wiring layer 122b and fourth build-up wiring layer 122d from the second and third build-up insulating layers 121b and 121c. On the other hand, a surface treatment layer may be formed on the respective exposed surfaces of the second and fourth build-up wiring layers 122b and 122d. The surface treatment layer may be formed by, for example, electrolytic gold plating, electroless gold plating, Organic Solderability Preservative (OSP) or electroless tin plating, electroless silver plating, electroless nickel plating/displacement gold plating, Direct Immersion Gold (DIG) plating, Hot Air Solder Leveling (HASL) or the like. Each opening may comprise a plurality of via holes. Under Bump Metal (UBM) may also be disposed on respective openings.

The electronic component 150 may be various kinds of active components and/or passive components. For example, the electronic component 150 may be various types of integrated circuit (IC) dies or packaged ICs with redistribution layers formed on the dies. Alternatively, the electronic component 150 may be a passive component having a chip form, such as a chip capacitor such as a multilayer ceramic capacitor (MLCC), a chip inductor such as a power inductor (PI), or the like. Alternatively, the electronic component 150 may be a silicon capacitor. As such, the type of the electronic component 150 is not particularly limited. The electronic component 150 may include a connection electrode 150P including a metal material such as copper (Cu) and aluminum (Al). The connection electrode 150P may be connected to the first build-up wiring layer 122a through the connection via of the first build-up via layer 123a. If appropriate, the electronic component 150 may be embedded in the opposite direction, and in this case, the connection electrode 150P may be connected to the third build-up wiring layer 122c through the connection via of the third build-up via layer 123c. If appropriate, a dummy silicon die, a metal mass, or the like may be disposed together with the electronic component 150 or in place of the electronic component 150.

If desired, the electrical connection metal bump 190 may be respectively disposed on the plurality of openings of the second passivation layer 140. The electrical connection metal bump 190 may be electrically connected to the exposed fourth build-up wiring layer 122d. The electrical connection metal bump 190 may physically and/or electrically connect the printed circuit board 100A with the outside thereof. For example, the printed circuit board 100A according to an example may be mounted on a main board of the electronic device through the plurality of electrical connection metal bumps 190. For example, the printed circuit board 100A according to an example may be a BGA type package substrate. The electrical connection metal bump 190 may include a low melting point metal having a lower melting point than that of copper (Cu), for example, tin (Sn) or an alloy including tin (Sn). For example, the electrical connection metal bump 190 may be formed of a solder, but only by way of an example, and thus, the material thereof is not particularly limited thereto. The electrical connection metal bump 190 may be a land, a ball, a pin, or the like. The electrical connection metal bump 190 may be formed of multiple layers or a single layer. When the electrical connection metal bump 190 is formed of multiple layers, the electrical connection metal bump 190 may include a copper pillar (pillar) and solder, and when formed of a single layer, the electrical connection metal bump 190 may include tin-silver solder, but is also merely an example, and thus, an example thereof is not limited thereto. The number, spacing, arrangement, and the like of the electrical connection metal bumps 190 are not particularly limited, and may be sufficiently modified according to design considerations by those skilled in the art.

If desired, an electronic component 310 may be additionally disposed in the form of a surface mount on the first passivation layer 130. The electronic component 310 additionally disposed may also be an active component and/or a passive component. For example, the electronic component 310 may be an integrated circuit die or a packaged die. Alternatively, as the electronic component 310, various types of passive chip components may be used. These electronic components 310 may be surface mounted through a connection member 320 such as solder bumps disposed on the plurality of openings of the first passivation layer 130. These electronic components 310 may be electrically connected to the exposed second build-up wiring layer 122b.

If desired, the third and fourth build-up via layers 123c and 123d may further include high-density heat dissipation vias formed on the back surface side of the electronic component 150, and the third and fourth build-up wiring layers 122c and 122d may further include heat dissipation patterns connected to the heat dissipation vias.

Figure 4:
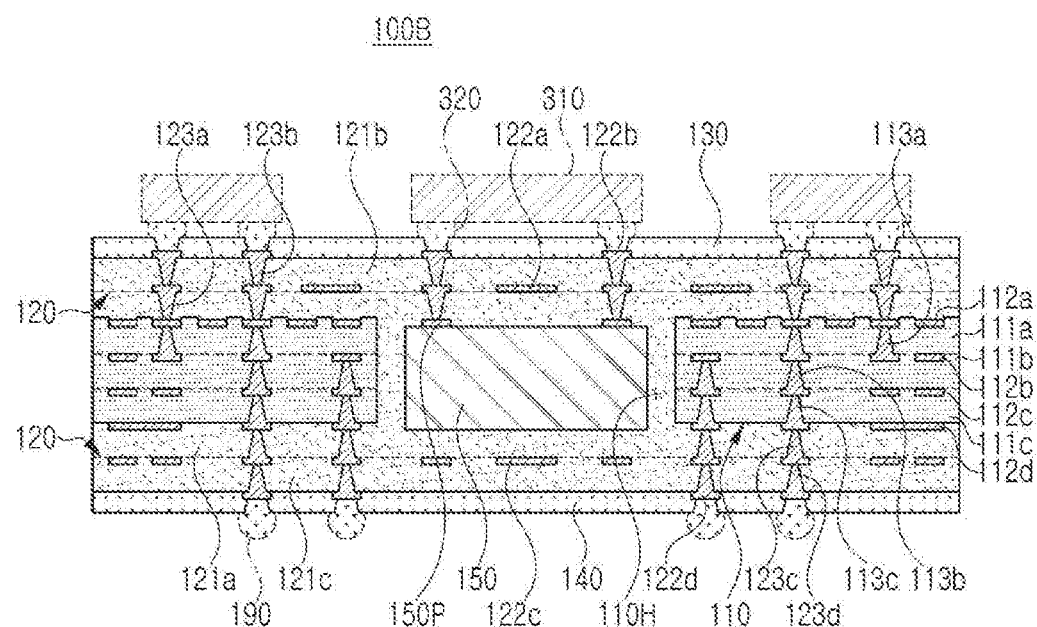
FIG. 4 is a cross-sectional view schematically illustrating a modified example of the printed circuit board of FIG. 3.

FIG. 4 is a cross-sectional view schematically illustrating a modified example of the printed circuit board of FIG. 3.

Referring to FIG. 4, a printed circuit board 100B according to a modified example may be configured in such a manner that a core structure 110 is comprised of a larger number of layers while being provided as a coreless substrate, compared with the printed circuit board 1100A according to the above-described example. For example, the core structure 110 may further include a third core insulating layer 111c disposed on a lower surface of a second core insulating layer 111b and covering a third core wiring layer 112c, a fourth core wiring layer 112d protruding from a lower surface of the third core insulating layer 111c, and a third core via layer 113c penetrating through the third core insulating layer 111c and connecting the third and fourth core wiring layers 112c and 112d. The third core via layer 113c may include a connection via having a profile tapered in the same direction as the first and second core via layers 113a and 113b. For example, the third core via layer 113c may include a tapered connection via having an upper width narrower than a lower width in a cross section thereof. The through-portion 110H may also penetrate through the third core insulating layer 111c. The thickness of the electronic component 150 may also be increased to match the thickness of the core structure 110. For example, the thickness of the core structure 110 may be changed to match the electronic component 150 having various thicknesses. Other contents are substantially the same as those described above, and thus, detailed descriptions thereof will be omitted.

Figure 5:
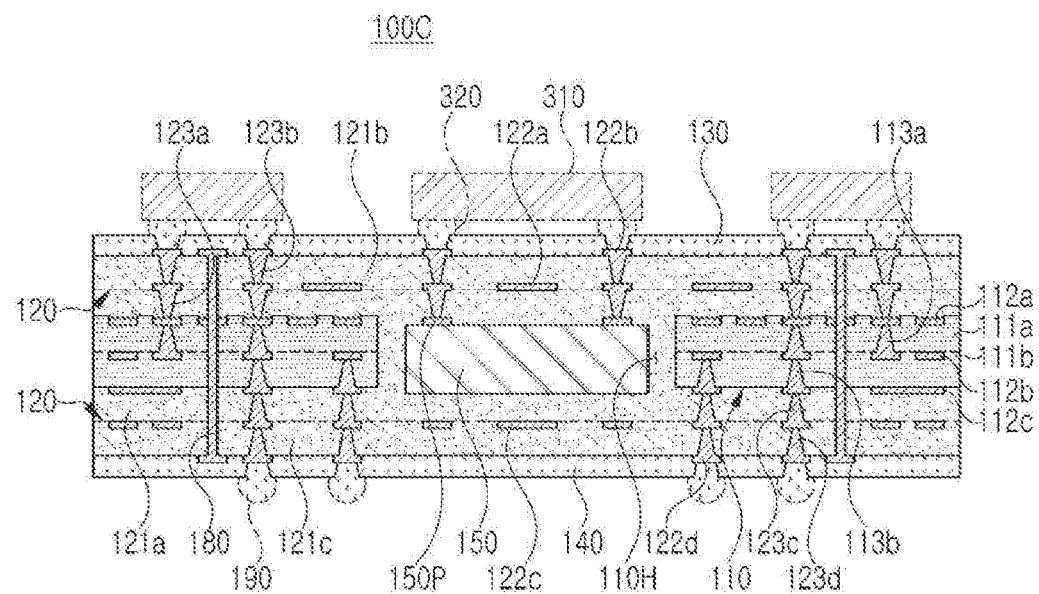
FIG. 5 is a schematic cross-sectional view illustrating a modified example of the printed circuit board of FIG. 3.

FIG. 5 is a schematic cross-sectional view illustrating a modified example of the printed circuit board of FIG. 3.

Referring to FIG. 5, a printed circuit board 100C according to a modified example further includes a through-via 180 in the printed circuit board 100A according to the above-described example. The through-via 180 may penetrate through at least two insulating layers among the first and second core insulating layers 111a and 111b and the first to third build-up insulating layers 121a, 121b and 121c. For example, the through-via 180 may penetrate through all of the first and second core insulating layers 111a and 111b and the first to third build-up insulating layers 121a, 121b and 121c as illustrated in FIG. 5. Alternatively, unlike in FIG. 5, the through-via 180 may penetrate through the first and second core insulating layers 111a and 111b, at least a portion of the first and second core insulating layers 111a and 111b and the first build-up insulating layer 121a, at least a portion of the first and second core insulating layers 111a and 111b and the first build-up insulating layer 121a or through the second build-up insulating layer 121b, or at least a portion of the first and second core insulating layers 111a and 111b and the first build-up insulating layer 121a and the third build-up insulating layer 121c. The through-via 180 may be connected to at least two wiring layers among the first to third core wiring layers 112a, 112b and 112c and the first to fourth build-up wiring layers 122a, 122b, 122c and 122d. The through-via 180 may directly penetrate through at least one of the first to third core wiring layers 112a, 112b and 112c and the first and third build-up wiring layers 122a and 122c. The through-via may have the form of a plated through hole (PTH). The inside of the PTH may be plated and filled with a metal material. Alternatively, the PTH may be formed by forming a plated layer along the wall and filling an insulating material a gap between the plated layers. Other contents are substantially the same as those described above, and thus, detailed descriptions thereof will be omitted.

Figure 6:
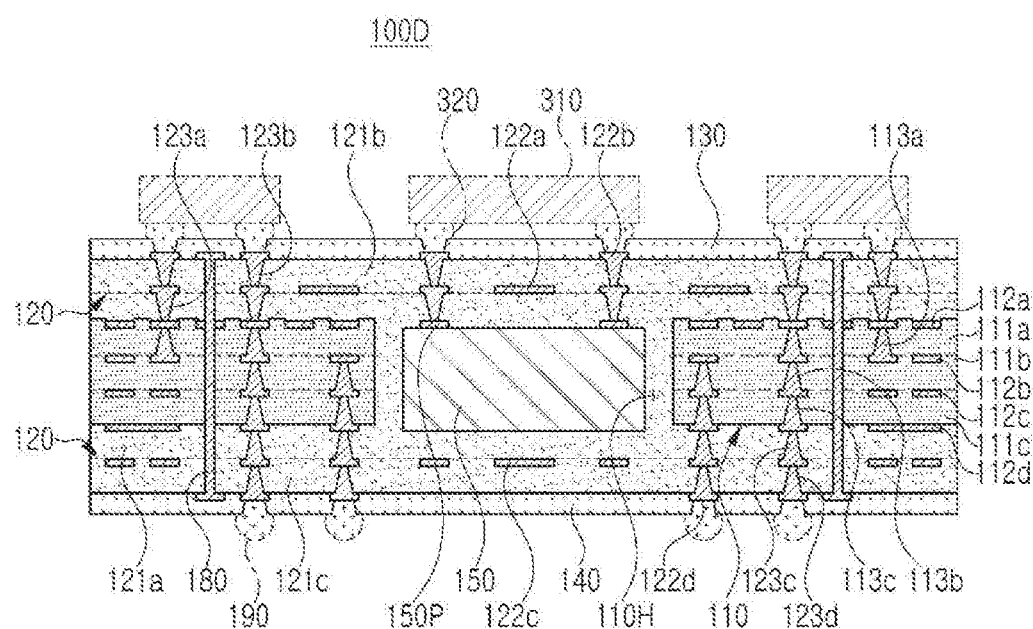
FIG. 6 is a cross-sectional view schematically illustrating a modified example of the printed circuit board of FIG. 3.

FIG. 6 is a cross-sectional view schematically illustrating a modified example of the printed circuit board of FIG. 3.

Referring to FIG. 6, a printed circuit board 100D according to a modified example may be configured in such a manner that a core structure 110 is comprised of a larger number of layers while being provided as a coreless substrate, compared with the printed circuit board 100A according to the above-described example. For example, the core structure 110 may further include a third core insulating layer 111c disposed on a lower surface of a second core insulating layer 111b and covering a third core wiring layer 112c, a fourth core wiring layer 112d protruding from a lower surface of the third core insulating layer 111c, and a third core via layer 113c penetrating through the third core insulating layer 111c and connecting the third and fourth core wiring layers 112c and 112d, and further includes a through-via 180. Since other contents are substantially the same as those described above, detailed descriptions thereof will be omitted.

Figure 7A:
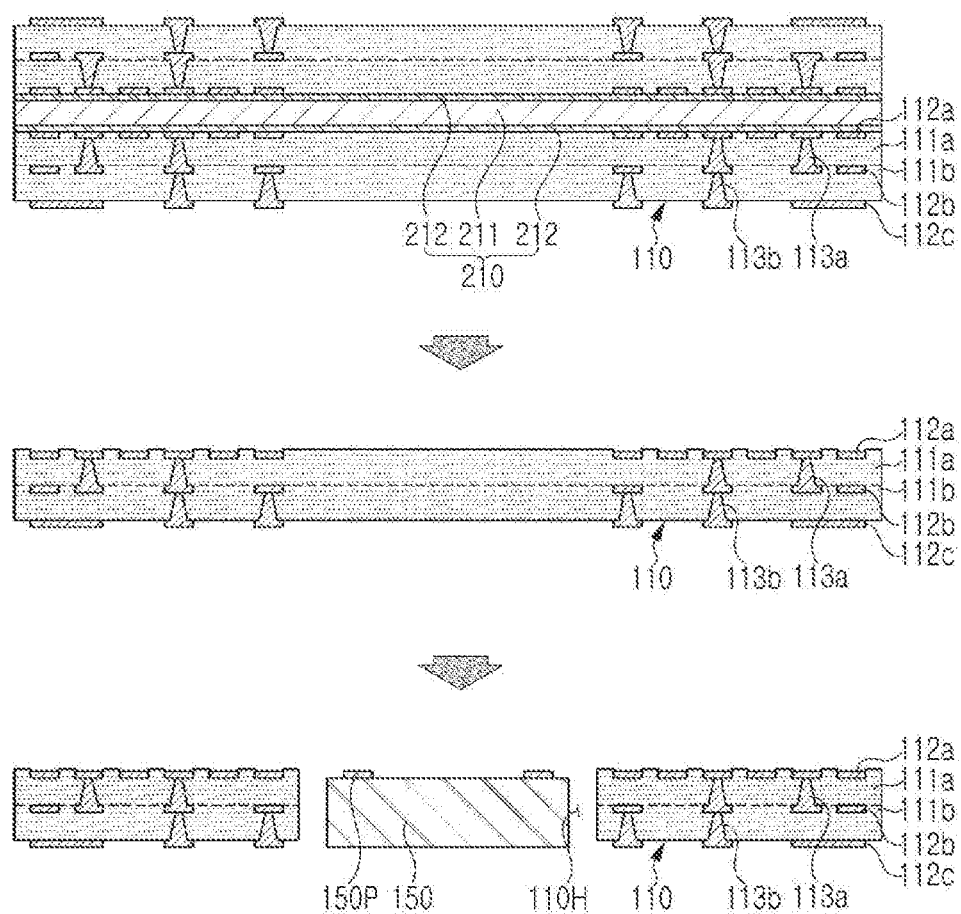
FIGS. 7A and 7B are process diagrams schematically illustrating an example process of manufacturing the printed circuit board of FIG. 3.
Figure 7B:
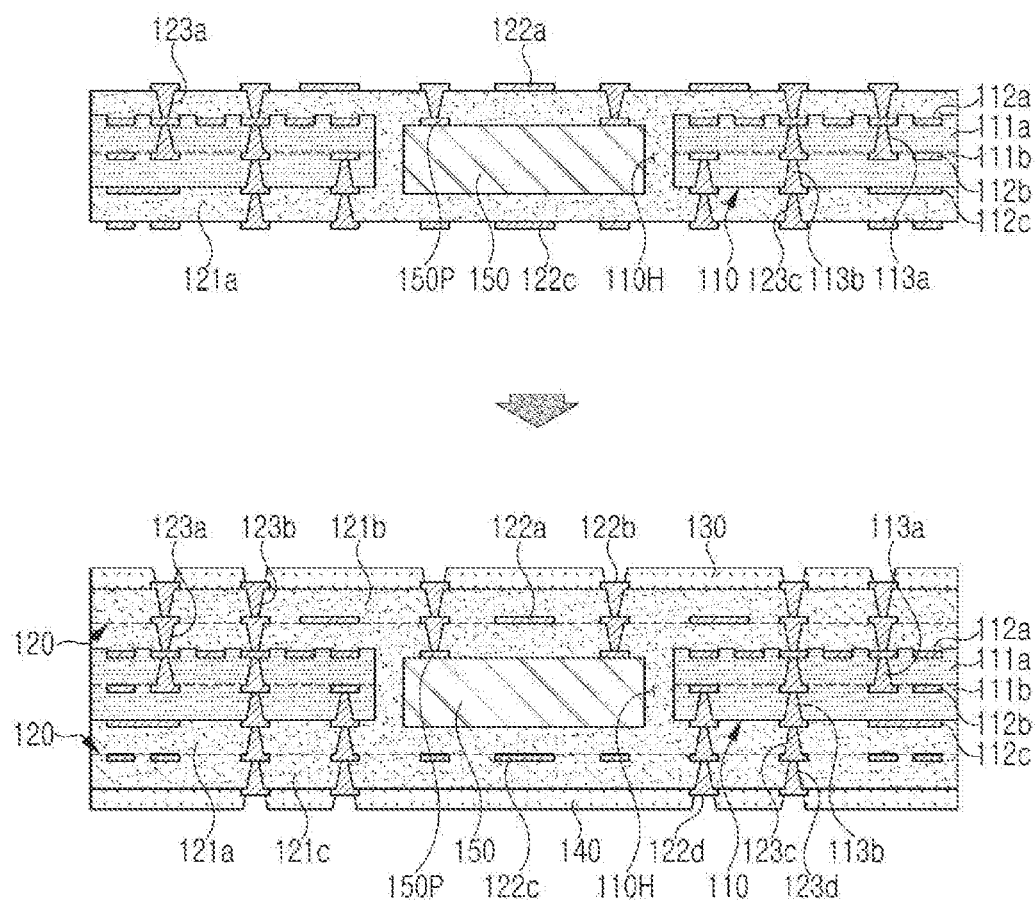

FIGS. 7A and 7B are process diagrams schematically illustrating an example of manufacturing the printed circuit board of FIG. 3.

Referring to FIGS. 7A and 7B, first, a detach carrier substrate 210 including a core layer 211 and metal foils 212 disposed on both surfaces of the core layer 211 is prepared. As the substrate 210, a copper clad laminate (CCL) may be used. Thereafter, the first core wiring layer 112a is formed by a plating process using the metal foil 212 as a lead wire. Thereafter, the first core insulating layer 111a is formed by prepreg lamination and curing. Thereafter, via holes are formed in the first core insulating layer 111a using a laser drill, and the second core wiring layer 112b and the first core via layer 113a are formed by a plating process. Then, the second core insulating layer 111b is formed by prepreg lamination and curing. Thereafter, via holes are formed in the second core insulating layer 111b by using a laser drill, and the third core wiring layer 112c and the second core via layer 113b are formed by a plating process. The core structure 110 may be formed on the upper side and the lower side of the substrate 210, respectively.

Next, the core structure 110 is separated from the core layer 211 of the substrate 210. In this case, the metal foil 212 may remain in the core structure 110 and may be removed by etching. On the other hand, in the case of simply building up the multilayer structure on the substrate 210 in a coreless form, since a process may be performed in a relatively thick substrate state, a problem of yield risk may occur, and the substrate 210 may be repeatedly chemically damaged in a repeated lamination process, thereby causing liquid permeation through a separated interface. On the other hand, in an example, the core structure 110 in the form of a coreless substrate is formed by forming layers on the substrate 210 in a desired number, thereby preventing the occurrence of the above-described problem, and lamination on both sides is formed to have a relatively small amount of layers on the substrate 210, thereby reducing warpage.

Next, a through-portion 110H penetrating through the first and second core insulating layers 111a and 111b is formed in the core structure 110 by using a laser drill and/or a mechanical drill. Thereafter, the electronic component 150 is disposed in the through-portion 110H using tape or the like. On the other hand, in the case of simply building up a multilayer in a coreless form on the substrate 210, forming the through-portion 110H for embedding the electronic component 150 may be difficult. On the other hand, in an example, the core structure 110 is formed by forming layers only in a desired number on the substrate 210, and the through-portion 110H is formed in the core structure 110, and then the electronic component 150 is disposed thereon, which may also be advantageous in terms of embedding the electronic component 150. The electronic component 150 may be disposed in a face-up form such that the connection electrode 150P faces upwards, but is not limited thereto. In contrast, the electronic component 150 may be disposed in a face-down form.

Next, the first build-up insulating layer 121a is formed by ABF lamination and curing on both sides of the core structure 110. The first build-up insulating layer 121a may fill the through-portion 110H in this process and may be formed to allow the electronic component 150 to be embedded therein. Thereafter, via holes are formed in the first build-up insulating layer 121a using a laser drill or the like, and the first and third build-up wiring layers 122a and 122c and the first and third build-up via layers 123a and 123c are formed by a plating process.

Next, the second and third build-up insulating layers 121b and 121c are formed on both sides of the first build-up insulating layer 121a through ABF double-side lamination and curing. Thereafter, via-holes are formed in the second and third build-up insulating layers 121b and 121c, respectively, by a laser drill, and the second and fourth build-up wiring layers 122b and 122d and the second and fourth build-up via layers 123b and 123d are formed in the plating process. Thereafter, the first and second passivation layers 130 and 140 are formed on the first and second build-up insulating layers 121b and 121c, respectively, through ABF lamination and curing, as desired.

If desired, the electrical connection metal bump 190 may be further formed, and the electronic component 310 may be further disposed in the form of a surface mount through the connection member 320. Through a series of processes, the printed circuit board 100A according to an example may be manufactured.

Figure 8:
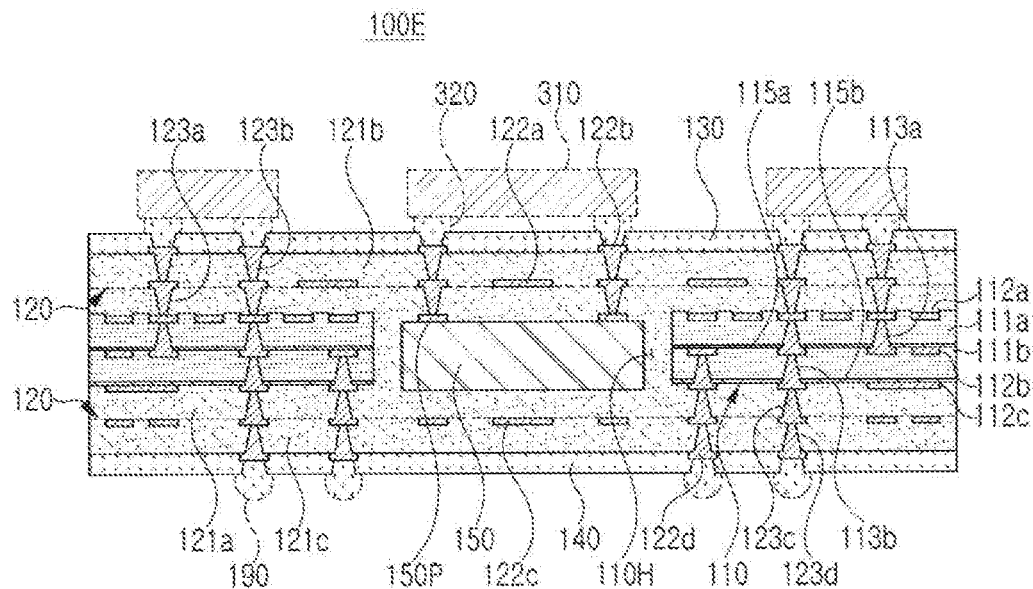
FIG. 8 is a schematic cross-sectional view illustrating another example of a printed circuit board.

FIG. 8 is a schematic cross-sectional view illustrating another example of a printed circuit board.

Referring to FIG. 8, in a printed circuit board 100E according to another example, the core structure 110 further includes first and second primer layers 115a and 115b. The first primer layer 115a is disposed on the lower surface of the first core insulating layer 111a. The first primer layer 115a may be disposed between the first core insulating layer 111a and the second core insulating layer 111b and between the first core insulating layer 111a and the second core wiring layer 112b. The second primer layer 115b is disposed on the lower surface of the second core insulating layer 111b. The second primer layer 115b may be disposed between the second core insulating layer 111b and the first build-up insulating layer 121a and between the second core insulating layer 111a and the third core wiring layer 112c. Each of the first and second primer layers 115a and 115b may be thinner than each of the first and second core insulating layers 111a and 111b. In addition, each of the first and second primer layers 115a and 115b may be thinner than each of the first to third build-up insulating layers 121a, 121b and 121c.

The through-portion 110H may also penetrate through the first and second primer layers 115a and 115b. The first and second core via layers 113a and 113b may penetrate through the first and second primer layers 115a and 115b, respectively. The first and second primer layers 115a and 115b may be insulating layers including insulating resins. In this case, the insulating resin may be an acrylic resin, an acrylic urethane resin, an epoxy resin, or combinations thereof, but an example thereof is not limited thereto. In the case of the first and second primer layers 115a and 115b, roughness may be easily formed, such that the plating adhesion may be relatively higher than that of the prepreg.

On the other hand, when prepreg is used as the material of the first and second core insulating layers 111a and 111b, performing the SAP plating process may be difficult due to insufficient plating adhesion. On the other hand, when the first and second primer layers 115a and 115b are introduced as in the other example, an SAP plating process may be easily used as described later in forming the second and third core wiring layers 112b and 112c and the first and second core via layers 113a and 113b. Thereby, the microcircuit pattern may be easily implemented. Other contents are substantially the same as those described above, and thus, detailed descriptions thereof will be omitted.

Figure 9:
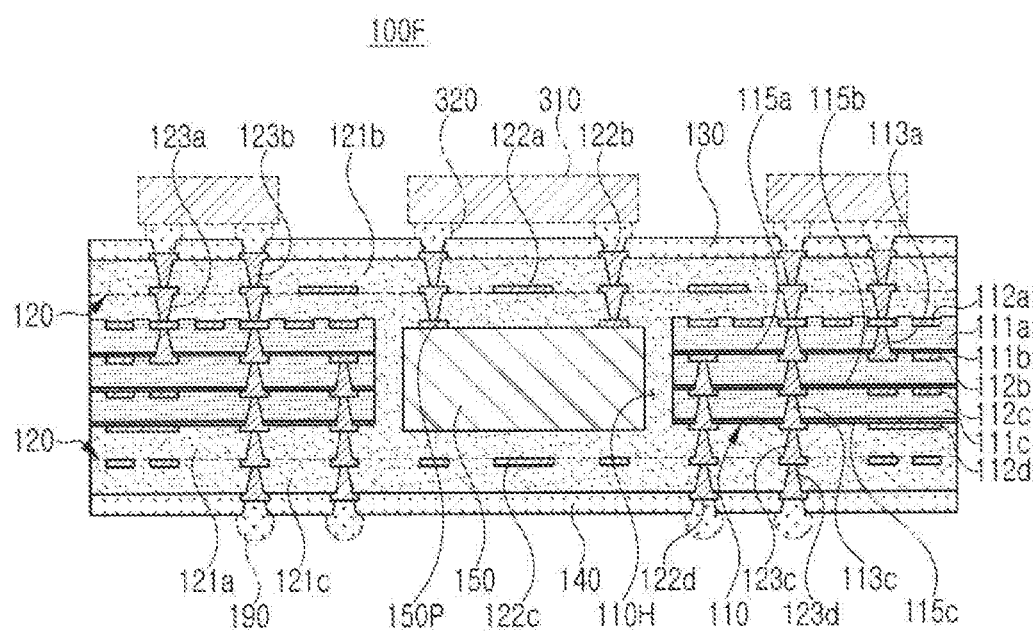
FIG. 9 is a cross-sectional view schematically illustrating a modified example of the printed circuit board of FIG. 8.

FIG. 9 is a cross-sectional view schematically illustrating a modified example of the printed circuit board of FIG. 8.

Referring to FIG. 9, a printed circuit board 100F according to a modified example includes the core structure 110 having a larger number of layers than that of the printed circuit board 100E according to the example described above. For example, the core structure 110 may further include a third core insulating layer 111c disposed on a lower surface of the second core insulating layer 111b and covering the third core wiring layer 112c, a fourth core wiring layer 112d protruding from a lower surface of the third core insulating layer 111c, and a third core via layer 113c penetrating through the third core insulating layer 111c and connecting the third and fourth core wiring layers 112c and 112d. In addition, the core structure 110 may further include a third primer layer 115c. The third primer layer 115c may be disposed on the lower surface of the third core insulating layer 111c. The third primer layer 115c may be disposed between the third core insulating layer 111c and the first build-up insulating layer 121a and between the third core insulating layer 111c and the fourth core wiring layer 112d. The through-portion 110H may also penetrate through the third primer layer 115c. The third core via layer 113c may also penetrate through the third primer layer 115c. Each of the first to third primer layers 115a, 115b, and 115c may be thinner than each of the first to third core insulating layers 111a, 111b, and 111c. In addition, each of the first to third primer layers 115a, 115b, and 115c may be thinner than each of the first to third build-up insulating layers 121a, 121b, and 121c. Since other contents are substantially the same as those described above, detailed descriptions thereof will be omitted.

Figure 10:
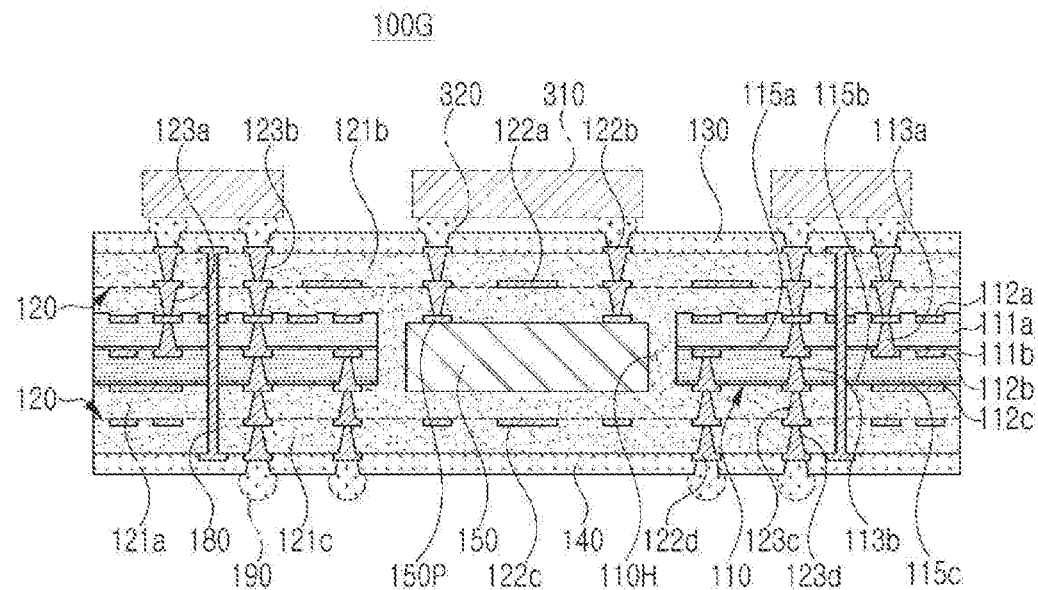
FIG. 10 is a cross-sectional view schematically illustrating a modified example of the printed circuit board of FIG. 8.

FIG. 10 is a cross-sectional view schematically illustrating a modified example of the printed circuit board of FIG. 8.

Referring to FIG. 10, a printed circuit board 100G according to a modified example further includes a through-via 180 in the printed circuit board 100E according to the above-described example described above. The through-via 180 may penetrate through at least two insulating layers of the first and second core insulating layers 111a and 111b and the first to third build-up insulating layers 121a, 121b and 121c. In addition, the through-via 180 may penetrate through at least one primer layer of the first and second primer layers 115a and 115b. The through-via 180 may be connected to at least two wiring layers of the first to third core wiring layers 112a, 112b and 112c and the first to fourth build-up wiring layers 122a, 122b, 122c and 122d. The through-via 180 may directly penetrate through at least one of the first to third core wiring layers 112a, 112b and 112c and the first and third build-up wiring layers 122a and 122c. Since other contents are substantially the same as those described above, detailed descriptions thereof will be omitted.

Figure 11:
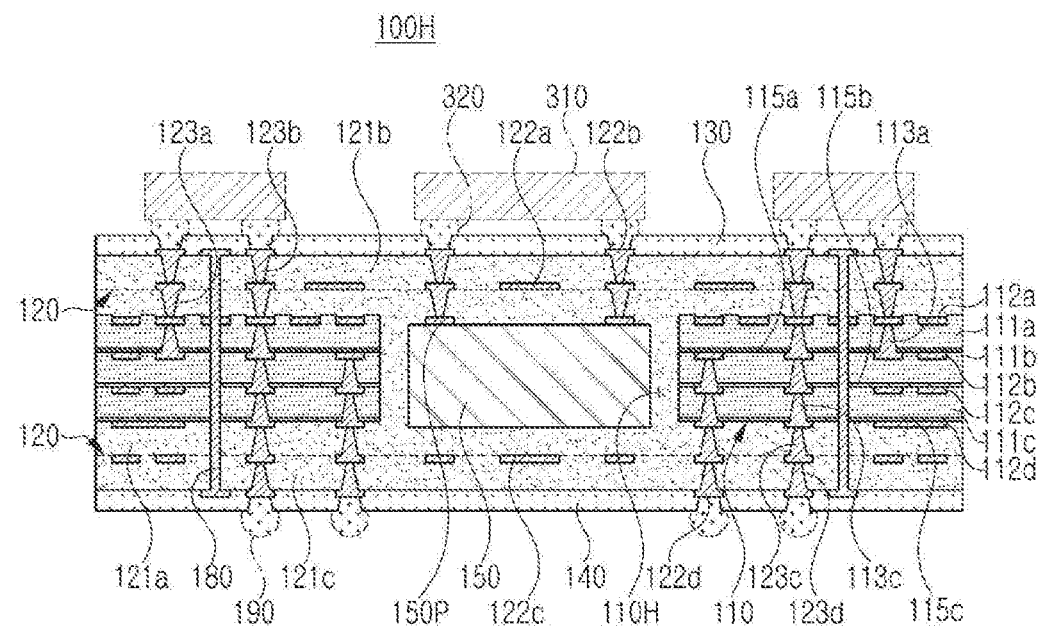
FIG. 11 is a schematic cross-sectional view illustrating a modified example of the printed circuit board of FIG. 8.

FIG. 11 is a schematic cross-sectional view illustrating a modified example of the printed circuit board of FIG. 8.

Referring to FIG. 11, a printed circuit board 100H according to a modified example may be configured in such a manner that a core structure 110 is comprised of a larger number of layers while being provided as a coreless substrate, compared with the printed circuit board 100E according to the above-described example. For example, the core structure 110 may further include a third core insulating layer 111c disposed on a lower surface of the second core insulating layer 111b and covering the third core wiring layer 112c, a fourth core wiring layer 112d protruding from a lower surface of the third core insulating layer 111c, and a third core via layer 113c penetrating through the third core insulating layer 111c and connecting the third and fourth core wiring layers 112c and 112d. In addition, the core structure 110 may further include a third primer layer 115c and may further include a through-via 180. Since other contents are substantially the same as those described above, detailed descriptions thereof will be omitted.

Figure 12A:
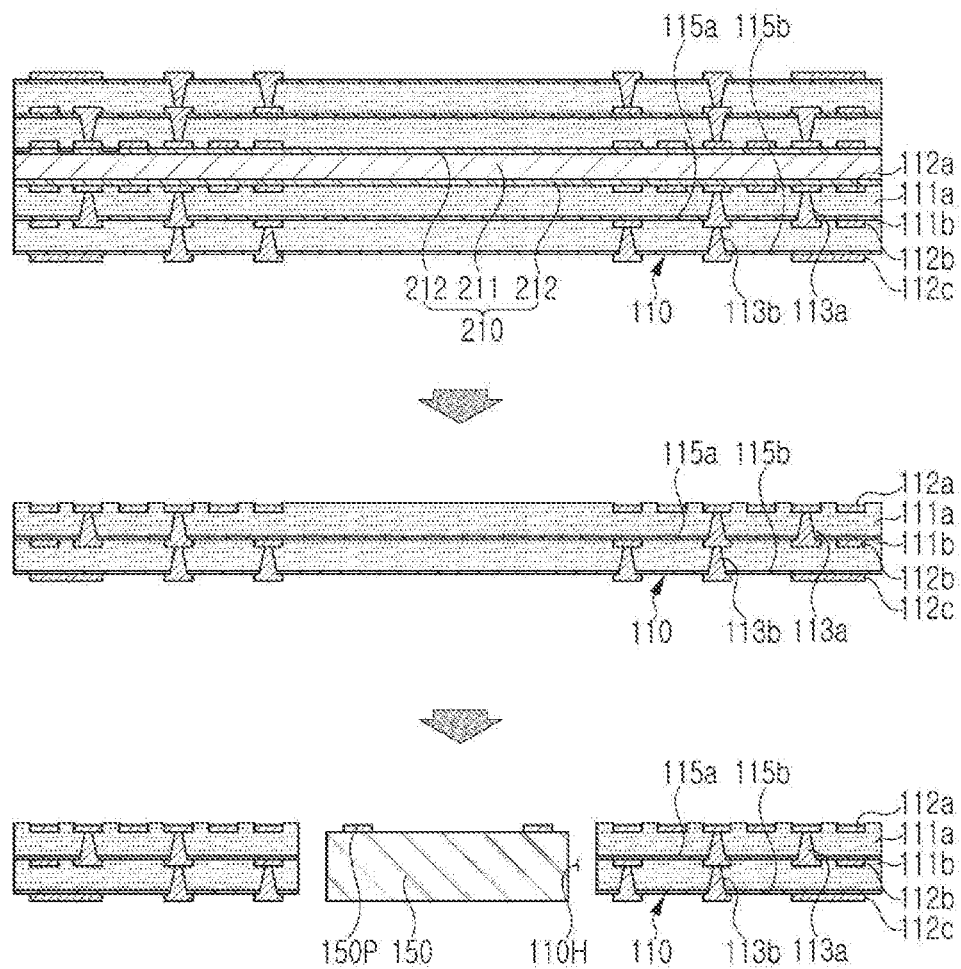
FIGS. 12A and 12B are process diagrams schematically illustrating an example process of manufacturing the printed circuit board of FIG. 8.
Figure 12B:
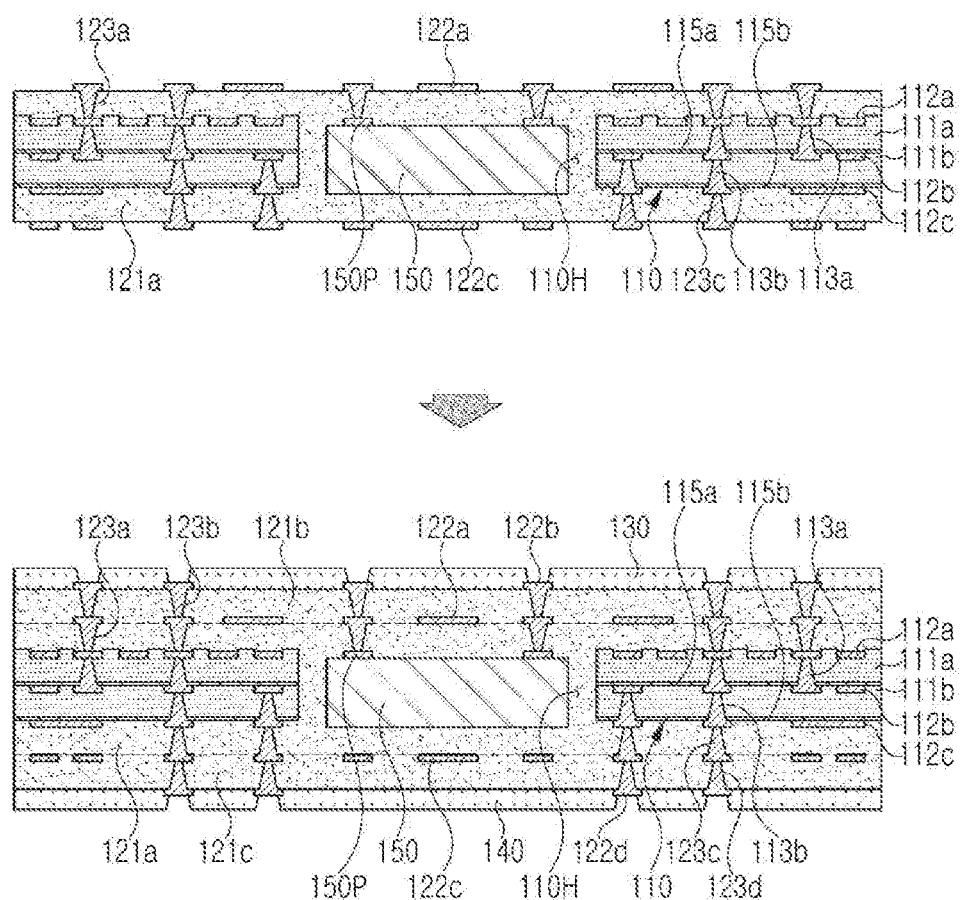

FIGS. 12A and 12B are process diagrams schematically illustrating an example of manufacturing the printed circuit board of FIG. 8.

Referring to FIGS. 12A and 12B, first, a detach carrier substrate 210 including a core layer 211 and metal foils 212 disposed on both surfaces of the core layer 211 is prepared. Thereafter, the first core wiring layer 112a is formed by an SAP plating process or the like. In this case, by further building up a primer metal foil as needed, the first core wiring layer 112a may also be easily formed by the SAP plating process. Thereafter, the first core insulating layer 111a is formed by prepreg lamination and curing. In addition, the first primer layer 115a is formed on the first core insulating layer 111a by coating or laminating. In this case, a material in which the primer layer is formed on the prepreg may also be used. Thereafter, via holes are formed in the first core insulating layer 111a and the first primer layer 115a using a laser drill or the like, and the second core wiring layer 112b and the first core via layer 113a are formed by an SAP plating process or the like. Thereafter, the second core insulating layer 111b is formed by prepreg lamination and curing. In addition, the second primer layer 115b is formed on the second core insulating layer 111b by coating or laminating. In this case, a material in which the primer layer is formed on the prepreg may also be used. Thereafter, via holes are formed in the second core insulating layer 111b and the second primer layer 115b using a laser drill or the like, and the third core wiring layer 112c and the second core via layer 113b are formed by an SAP plating process or the like. As such, the SAP plating process for all layers may be performed to implement a fine circuit with tight lines and spaces. On the other hand, if desired, by applying another plating process such as MSAP or TT to some layers in addition to the SAP plating process, a mixed structure having flexibility of design rules may also be implemented. In a series of processes, the core structure 110 may be formed on the upper side and the lower side of the substrate 210, respectively.

Next, the core structure 110 is separated from the core layer 211 of the substrate 210. In this case, the metal foil 212 may remain in the core structure 110 and may be removed by etching. On the other hand, in the case of simply building up the multilayer in a coreless form on the substrate 210, since a process may be performed in a relatively thick substrate state, a problem of yield risk may occur, and the substrate 210 may be repeatedly chemically damaged in a repeated lamination process, thereby causing liquid permeation through a separated interface. On the other hand, in another example, the core structure 110 is formed by forming layers only in a desired number on the substrate 210, thereby reducing the occurrence of the above-described problem, and double-sided lamination is performed in a relatively small amount of layers on the substrate 210, thereby reducing warpage in process.

Next, a through-portion 110H penetrating through the first and second core insulating layers 111a and 111b and the first and second primer layers 115a and 115b is formed in the core structure 110 by using a laser drill and/or a mechanical drill. Thereafter, the electronic component 150 is disposed in the through-portion 110H using a tape or the like. On the other hand, in the case of simply building up a multilayer in a coreless form on the substrate 210, forming the through-portion 110H for embedding the electronic component 150 therein may be difficult. On the other hand, in another example, the core structure 110 is formed by forming a layer on the substrate 210 only in a desired amount, and the through-portion 110H is formed in the core structure 110, and then the electronic component 150 is disposed therein, which may also be advantageous in terms of embedding the electronic component 150. The electronic component 150 may be disposed in a face-up form such that the connection electrode 150P faces upwards, but an example thereof is not limited thereto. Alternatively, the electronic component 150 may be disposed in a face-down form.

Next, the first build-up insulating layer 121a is formed by ABF lamination and curing on both sides of the core structure 110. The first build-up insulating layer 121a may fill the through-portion 110H in this process, and the electronic component 150 may be embedded in this process. Thereafter, via holes are formed in the first build-up insulating layer 121a using a laser drill or the like, and the first and third build-up wiring layers 122a and 122c and the first and third build-up via layers 123a and 123c are formed by a plating process. Since the first build-up insulating layer 121a may be ABF, the SAP plating process may be easily performed without the primer layer.

Next, second and third build-up insulating layers 121b and 121c are formed on both sides of the first build-up insulating layer 121a through ABF lamination and curing thereon. Thereafter, via-holes are formed in the second and third build-up insulating layers 121b and 121c, respectively, by a laser drill, and the second and fourth build-up wiring layers 122b and 122d and the second and fourth build-up via layers 123b and 123d are formed in the plating process. Since the second and third build-up insulating layers 121b and 121c may be ABF, the SAP plating process may be easily performed without the primer layer. Thereafter, the first and second passivation layers 130 and 140 are formed on the first and second build-up insulating layers 121b and 121c, respectively, through ABF lamination and curing, as appropriate.

If desired, the electrical connection metal bump 190 may be further formed, and the electronic component 310 may be further disposed in the form of a surface mount through the connection member 320. Through a series of processes, the printed circuit board 100E according to another example may be manufactured.

Figure 13:
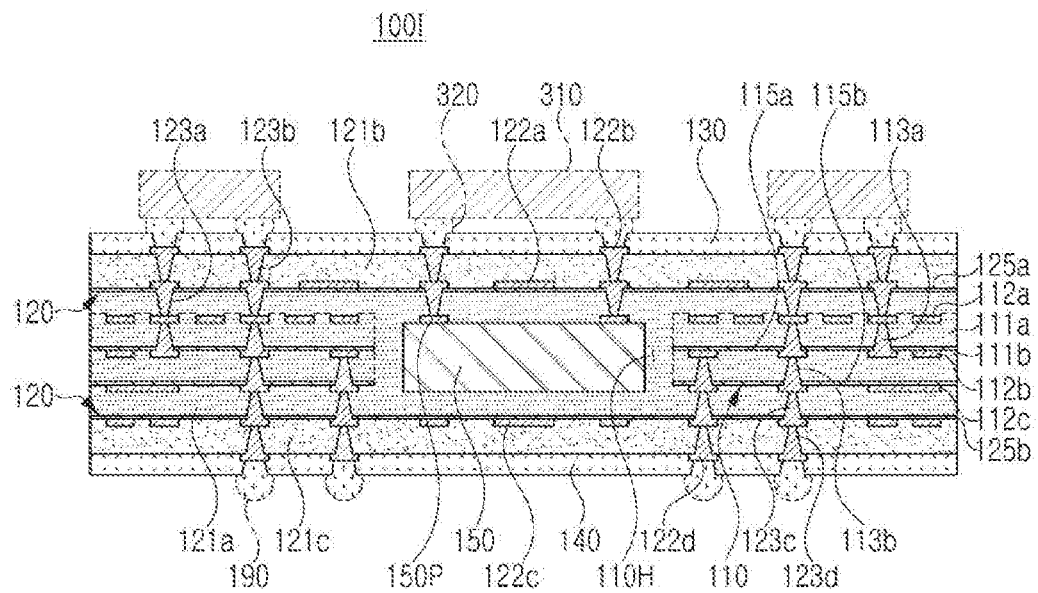
FIG. 13 is a schematic cross-sectional view illustrating another example of a printed circuit board.

FIG. 13 is a schematic cross-sectional view illustrating another example of a printed circuit board.

Referring to FIG. 13, in the case of a printed circuit board 100I according to another example, the first build-up insulating layer 121a includes the same type of material as that of the first and second core insulating layers 111a and 111b. For example, the first build-up insulating layer 121a may also be formed of a material including an insulating resin, an inorganic filler, and glass fiber, such as a prepreg. The first build-up insulating layer 121a may also have a higher elastic modulus than that of each of the second and third build-up insulating layers 121b and 121c. The boundary between the first build-up insulating layer 121a and the first and second core insulating layers 111a and 111b may be unclear, but an example thereof is not limited thereto, and for example, the boundary may be distinguished even when the same type of material is used therefor. Additional stiffness may be provided by using prepreg or the like as the material of the first build-up insulating layer 121a that fills the through-portion 110H and embeds the electronic component 150 therein.

On the other hand, first and second build-up primer layers 125a and 125b may be disposed on the upper and lower surfaces of the first build-up insulating layer 121a. The first build-up primer layer 125a is disposed between the first build-up insulating layer 121a and the second build-up insulating layer 121b and between the first build-up insulating layer 121a and the first build-up wiring layer 122a. The second build-up primer layer 125b is disposed between the first build-up insulating layer 121a and the third build-up insulating layer 121c and between the first build-up insulating layer 121a and the third build-up wiring layer 122c. The first and third build-up via layers 123a and 123c may also penetrate through the first and second build-up primer layers 125a and 125b, respectively. The first and second build-up primer layers 125a and 125b may be insulating layers including an insulating resin. In this case, the insulating resin may be an acrylic resin, an acrylic urethane resin, an epoxy resin, or combinations thereof, but is not limited thereto. In the case of the first and second build-up primer layers 125a and 125b, roughness may be easily formed, so that the plating adhesion thereof may be relatively higher than that of the prepreg.

On the other hand, in the case in which the prepreg is used as the material of the first build-up insulating layer 121a, performing the SAP plating process may be difficult due to the plating adhesion problem. On the other hand, when the first and second build-up primer layers 125a and 125b are introduced as in another example, the SAP plating process may be utilized easily as described later in forming the first and third build-up wiring layers 122a and 122c and the first and third build-up via layers 123a and 123c. Thereby, the microcircuit pattern may be easily implemented.

The second and third build-up insulating layers 121b and 121c are respectively multilayered, and at least one of the second and third build-up insulating layers 121b and 121c may also be formed of a material including an insulating resin, an inorganic filler and glass fiber, such as a prepreg, thereby further adding rigidity. In this case, the build-up primer layer may be further disposed in an appropriate position. Since other contents are substantially the same as those described above, detailed descriptions thereof will be omitted.

Figure 14:
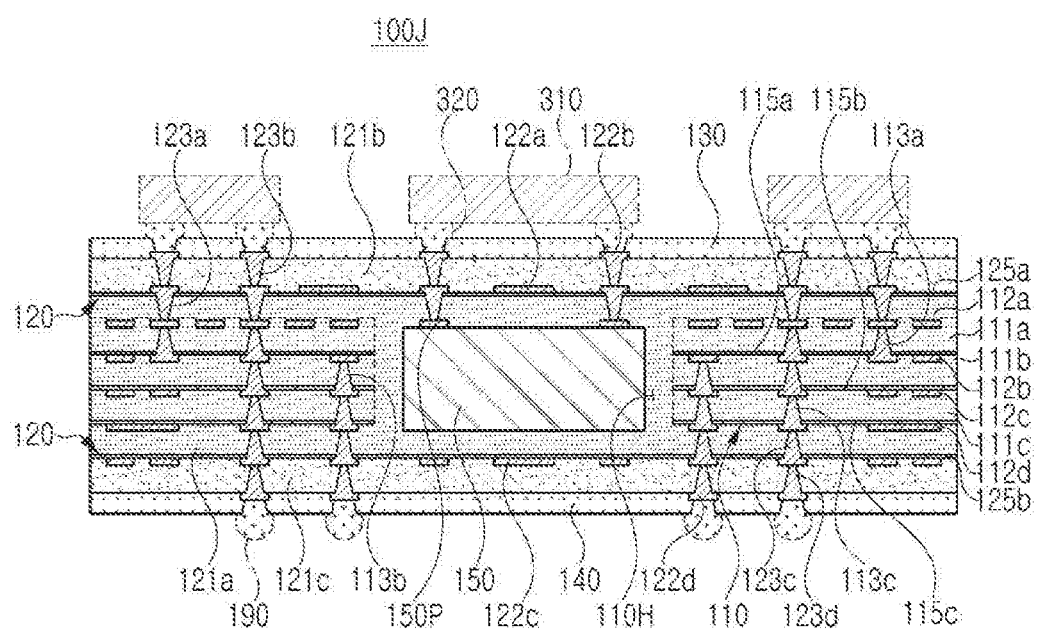
FIG. 14 is a schematic cross-sectional view illustrating a modified example of the printed circuit board of FIG. 13.

FIG. 14 is a schematic cross-sectional view illustrating a modified example of the printed circuit board of FIG. 13.

Referring to FIG. 14, a printed circuit board 100J according to a modified example has a core structure 110 comprised of a relatively greater number of layers. For example, the core structure 110 may further include a third core insulating layer 111c disposed on the lower surface of a second core insulating layer 111b and covering a third core wiring layer 112c, a fourth core wiring layer 112d protruding from a lower surface of a third core insulating layer 111c, and a third core via layer 113c penetrating through the third core insulating layer 111c and electrically connecting the third and fourth core wiring layers 112c and 112d. The core structure 110 may further include a third primer layer 115c.

The third primer layer 115c may be disposed on the lower surface of the third core insulating layer 111c. The third primer layer 115c may be disposed between the third core insulating layer 111c and the first build-up insulating layer 121a and between the third core insulating layer 111c and the fourth core wiring layer 112d. Since other contents are substantially the same as those described above, detailed descriptions thereof will be omitted.

Figure 15:
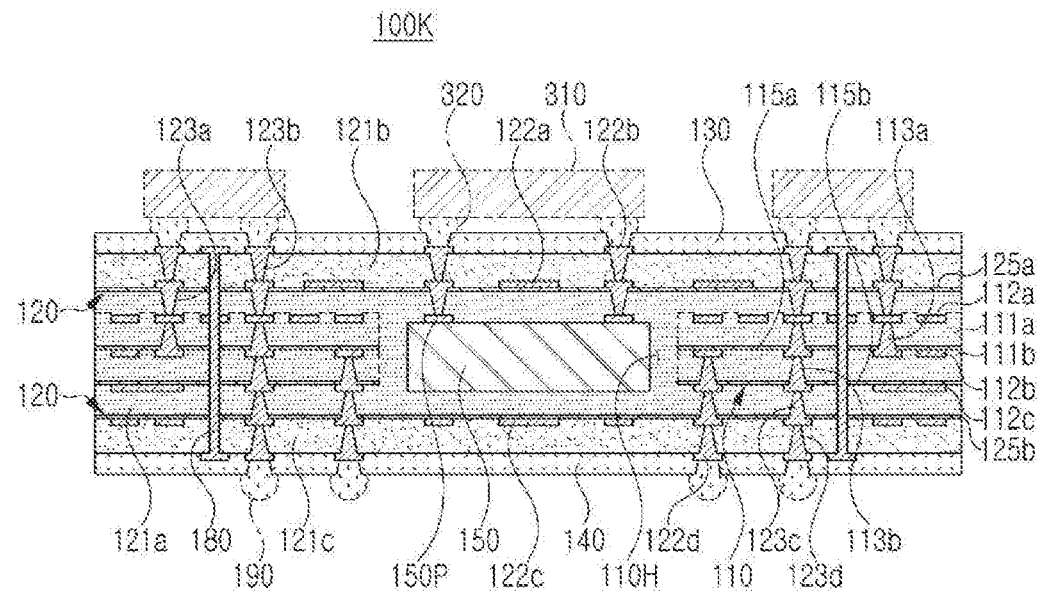
FIG. 15 is a schematic cross-sectional view illustrating a modified example of the printed circuit board of FIG. 13.

FIG. 15 is a schematic cross-sectional view illustrating a modified example of the printed circuit board of FIG. 13.

Referring to FIG. 15, a printed circuit board 100K according to a modified example further includes a through-via 180 in the printed circuit board 100I according to another example described above. The through-via 180 may penetrate through at least two insulating layers among the first and second core insulating layers 111a and 111b and the first to fourth build-up insulating layers 121a, 121b and 121c. In addition, the through-via 180 may penetrate through at least two primer layers among the first and second primer layers 115a and 115b and the first and second build-up primer layers 125a and 125b. The through-via 180 may be connected to at least two wiring layers among the first to third core wiring layers 112a, 112b and 112c and the first to fourth build-up wiring layers 122a, 122b, 122c and 122d. The through-via 180 may directly penetrate through at least one of the first to third core wiring layers 112a, 112b and 112c and the first and third build-up wiring layers 122a and 122c. Since other contents are substantially the same as those described above, detailed descriptions thereof will be omitted.

Figure 16:
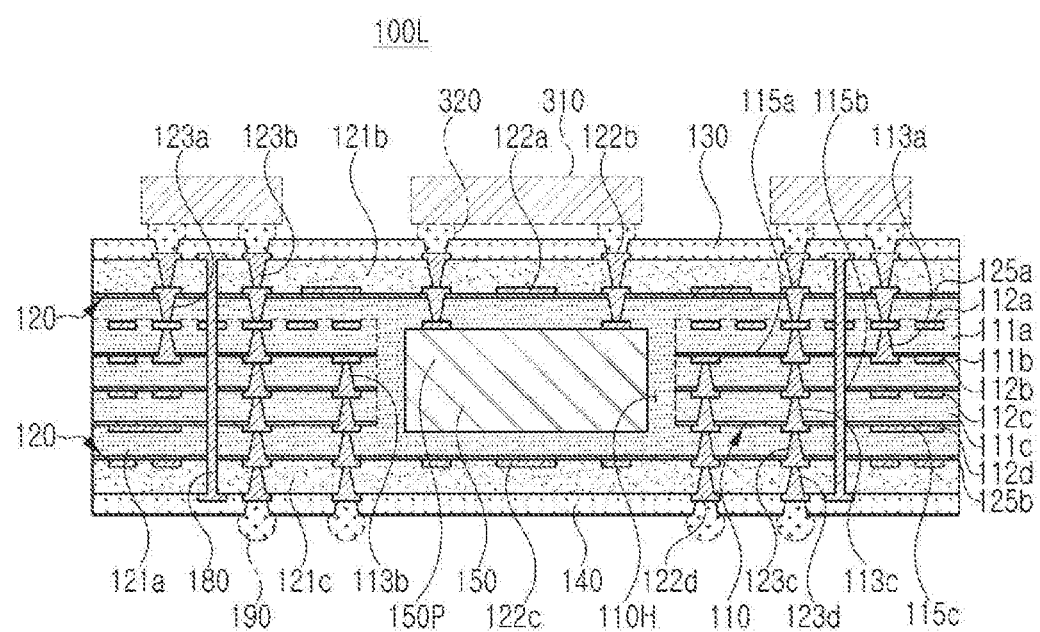
FIG. 16 is a schematic cross-sectional view illustrating a modified example of the printed circuit board of FIG. 13.

FIG. 16 is a schematic cross-sectional view illustrating a modified example of the printed circuit board of FIG. 13.

Referring to FIG. 16, a printed circuit board 100L according to a modified example is configured in such a manner that a core structure 110 is a coreless substrate and has a relatively larger number of layers, as compared with the printed circuit board 100I according to another example described above. For example, the core structure 110 may further include a third core insulating layer 111c disposed on the lower surface of a second core insulating layer 111b and covering a third core wiring layer 112c, a fourth core wiring layer 112d protruding from a lower surface of a third core insulating layer 111c, and a third core via layer 113c penetrating through the third core insulating layer 111c and electrically connecting the third and fourth core wiring layers 112c and 112d. The core structure 110 may further include a third primer layer 115c, and may further include a through-via 180. Since other contents are substantially the same as those described above, detailed descriptions thereof will be omitted.

Figure 17A:
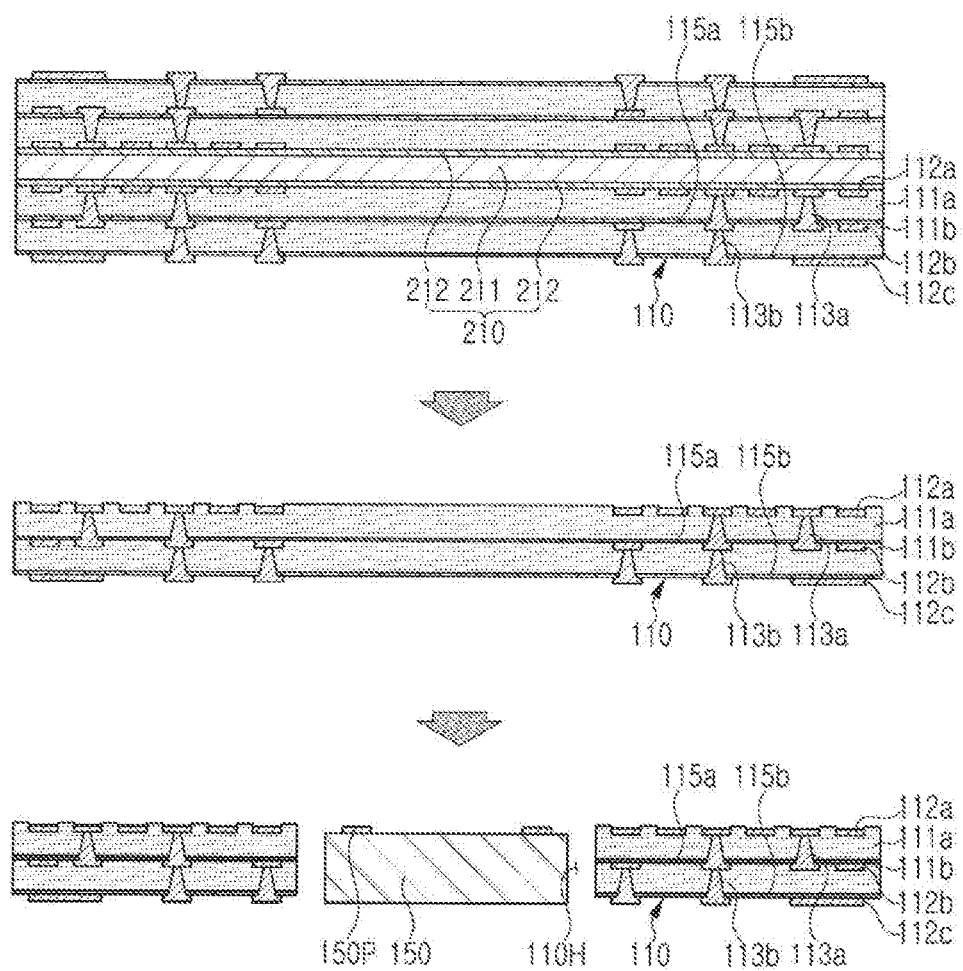
FIGS. 17A and 17B are process diagrams schematically illustrating an example process of manufacturing the printed circuit board of FIG. 13.
Figure 17B:
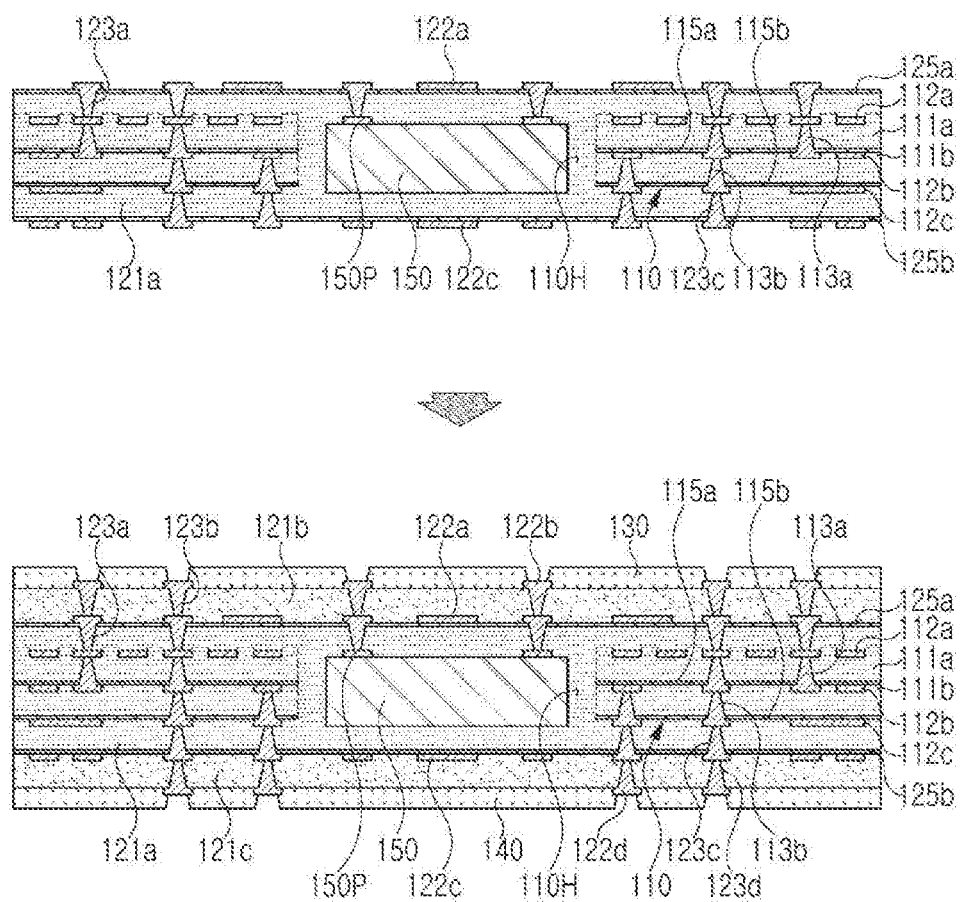

FIGS. 17A and 17B are process diagrams schematically illustrating an example of manufacturing the printed circuit board of FIG. 13.

Referring to FIGS. 17A and 17B, first, a detach carrier substrate 210 including a core layer 211 and metal foils 212 disposed on both surfaces of the core layer 211 is prepared. Thereafter, a first core wiring layer 112a is formed by a plating process. In this case, by further building up a primer metal foil as needed, the first core wiring layer 112a may also be easily formed by the SAP plating process. Thereafter, a first core insulating layer 111a is formed by prepreg lamination and curing. In addition, a first primer layer 115a is formed on the first core insulating layer 111a by coating or laminating, and may also be formed using a material in which the primer layer is formed on the prepreg. Thereafter, via holes are formed in the first core insulating layer 111a and the first primer layer 115a using a laser drill or the like, and a second core wiring layer 112b and a first core via layer 113a are formed by an SAP plating process or the like. Thereafter, a second core insulating layer 111b is formed by prepreg lamination and curing. In addition, a second primer layer 115b is formed on the second core insulating layer 111b by coating or laminating. In this case, a material in which the primer layer is formed on the prepreg may also be used. Thereafter, via holes are formed in the second core insulating layer 111b and the second primer layer 115b using a laser drill or the like, and a third core wiring layer 112c and a second core via layer 113b are formed by an SAP plating process or the like. As such, the SAP plating process may be performed on all the layers to implement a fine circuit with tight lines and spaces. On the other hand, if desired, by applying another plating process such as MSAP or TT to some layers in addition to the SAP plating process, a mixed structure providing flexibility of design rules may be implemented. Through a series of processes, the core structure 110 may be formed on the upper side and the lower side of the substrate 210, respectively.

Next, the core structure 110 is separated from the core layer 211 of the substrate 210. In this case, the metal foil 212 may remain in the core structure 110 and may be removed by etching. On the other hand, in the case of simply building up the multilayer in a coreless form on the substrate 210, since a process may be performed in a relatively thick substrate state, a problem of yield risk may occur, and the substrate 210 may be repeatedly chemically damaged in an iterative lamination process, thereby causing liquid permeation through a separated interface. On the other hand, in another example, the core structure 110 is formed by forming a desired number of layers on the substrate 210, thereby reducing the occurrence of the above-described problem, and double-sided lamination may be performed with a relatively small amount of layers on the substrate 210, thereby reducing warpage in process.

Next, a through-portion 110H penetrating through the first and second core insulating layers 111a and 111b and the first and second primer layers 115a and 115b is formed in the core structure 110 by using a laser drill and/or a mechanical drill. Thereafter, the electronic component 150 is disposed in the through-portion 110H using a tape or the like. On the other hand, in the case of simply building up a multilayer in a coreless form on the substrate 210, forming the through-portion 110H for embedding the electronic component 150 therein may be difficult. On the other hand, in another example, the core structure 110 is formed by forming a layer on the substrate 210 only in an appropriate amount, and the through-portion 110H is formed in the core structure 110, and then the electronic component 150 is disposed therein, which may also be advantageous in terms of embedding the electronic component 150. The electronic component 150 may be disposed in a face-up form such that the connection electrode 150P faces upwards, but an example thereof is not limited thereto. In contrast, the electronic component 150 may be disposed in a face-down form.

Next, the first build-up insulating layer 121a is formed by performing prepreg lamination and curing on both sides of the core structure 110. In addition, the first and second build-up primer layers 125a and 125b are formed on both surfaces of the first build-up insulating layer 121a by coating or laminating. In this case, a material in which the primer layer is formed on the prepreg may also be used. The first build-up insulating layer 121a may fill the through-portion 110H in this process, in such a manner that the electronic component 150 may be embedded in this process.

Thereafter, via holes are formed in the first build-up insulating layer 121a and the first and second build-up primer layers 125a and 125b by using a laser drill or the like, and the first and third build-up wiring layers 122a and 122c and the first and third build-up via layers 123a and 123c are formed by an SAP plating process or the like.

Next, the second and third build-up insulating layers 121b and 121c are formed on both sides of the first build-up insulating layer 121a through ABF double-side lamination and curing. Thereafter, via-holes are formed in the second and third build-up insulating layers 121b and 121c, respectively, using a laser drill or the like, and the third and fourth build-up wiring layers 122c and 122d and the third and fourth build-up via layers 123c and 123d are formed in the plating process. Since the second and third build-up insulating layers 121b and 121c may be formed of ABF, the SAP plating process may be easily performed without the primer layer. Thereafter, first and second passivation layers 130 and 140 are formed on the first and second build-up insulating layers 121b and 121c through ABF lamination and curing, respectively, as appropriate.

If desired, an electrical connection metal bump 190 may be further formed, and an electronic component 310 may be further disposed in the form of a surface mount through a connection member 320. Through a series of processes, the printed circuit board 100I according to the example may be manufactured.

Figure 18:
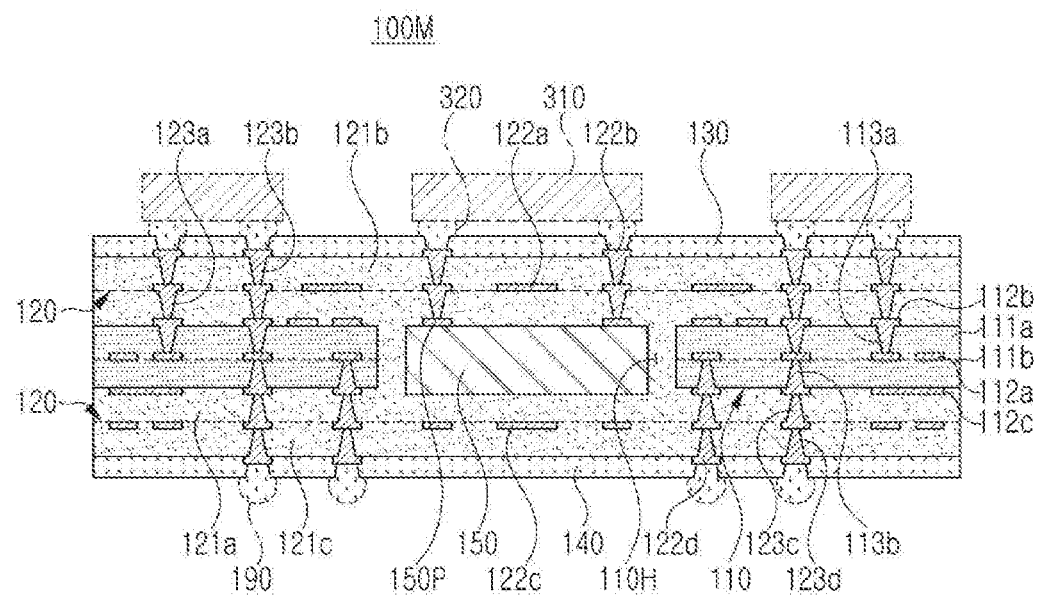
FIG. 18 is a schematic cross-sectional view illustrating another example of a printed circuit board.

FIG. 18 is a schematic cross-sectional view illustrating another example of a printed circuit board.

Referring to FIG. 18, a printed circuit board 100M according to another example is configured in such a manner that a core structure 110 has a coreless substrate structure in another form. For example, the core structure 110 may include a first core insulating layer 111a, a first core wiring layer 112a embedded in the first core insulating layer 111a and having a lower surface exposed from the lower surface of the first core insulating layer 111a, a second core insulating layer 111b disposed on the lower surface of the first core insulating layer 111a and covering the exposed lower surface of the first core wiring layer 112b, a second core wiring layer 112b protrudingly disposed on an upper surface of the first core insulating layer 111a, a third core wiring layer 112c protrudingly disposed on a lower surface of the second core insulating layer 111b, a first core via layer 113a penetrating through the first core insulating layer 111a and connecting the first and second core wiring layers 112a and 112b, and a second core via layer 113b penetrating through the second core insulating layer 111b and connecting the first and third core wiring layers 112a and 112c. In another example, the core structure 110 may include second and third core wiring layers 112b and 112c provided as protruding patterns on both sides thereof. Therefore, the core structure 110 may have a more symmetrical structure, and thus may have a relatively better technical effect in terms of bending.

The first and second core via layers 113a and 113b may respectively include connection vias having profiles tapered in opposite directions. For example, the first core via layer 113a may include a tapered connection via having an upper width greater than a lower width on a cross section. In addition, the second core via layer 113b may include a tapered connection via having an upper width narrower than a lower width on the cross section. The connection via of the first core via layer 113a may have a profile tapered in the same direction as the connection vias of the first and second build-up via layers 123a and 123b. The connection via of the second core via layer 113b may have a profile tapered in the same direction as the connection vias of the third and fourth build-up via layers 123c and 123d. As such, in another example, upper and lower connection vias may have tapered profiles in opposite directions to each other, centering on the first core wiring layer 112a of the core structure 110. Thus, it can be seen that the core structure 110 in another example also has a structure of a coreless substrate that does not include a separate core layer. Since other contents thereof are substantially the same as those described above, detailed descriptions thereof will be omitted.

Figure 19:
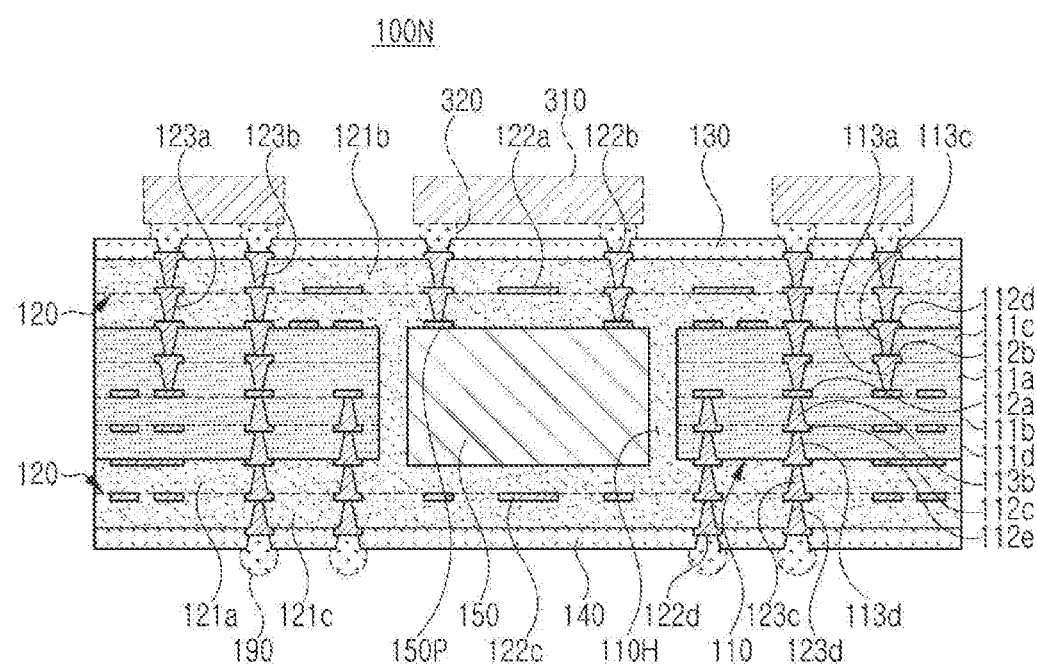
FIG. 19 is a schematic cross-sectional view illustrating a modified example of the printed circuit board of FIG. 18.

FIG. 19 is a schematic cross-sectional view illustrating a modified example of the printed circuit board of FIG. 18.

Referring to FIG. 19, a printed circuit board 100N according to a modified example includes a core structure 110 that is comprised of a relatively larger number of layers as compared with the printed circuit board 100M according to another example described above. For example, the core structure 110 may further include a third core insulating layer 111c disposed on an upper surface of the first core insulating layer 111a to cover the second core wiring layer 112b, a fourth core insulating layer 111d disposed on the lower surface of the second core insulating layer 111b to cover the third core wiring layer 112c, a fourth core wiring layer 112d protrudingly disposed on an upper surface of the third core insulating layer 111c, a fifth core wiring layer 112e protrudingly disposed on a lower surface of the fourth core insulating layer 111d, a third core via layer 113c penetrating through the third core insulating layer 111c and connecting the second and fourth core wiring layers 112b and 112d, and a fourth core via layer 113d penetrating through the fourth core insulating layer 111d and connecting the third and fifth core wiring layers 112c and 112e. If desired, the core structure 110 may also further include only the third core insulating layer 111c and the fourth core wiring layer 112d, or only the fourth core insulating layer 111d and the fifth core wiring layer 111e.

The third core via layer 113c may include a connection via having a profile tapered in the same direction as the first core via layer 113a. For example, the third core via layer 113c may include a tapered connection via having an upper width greater than a lower width on a cross section. The fourth core via layer 113d may include connection vias having a profile tapered in the same direction as the second core via layer 113b. For example, the fourth core via layer 113d may include a tapered connection via having an upper width narrower than a lower width on a cross section. The through-portion 110H may also penetrate through the third and fourth core insulating layers 111c and 111d. Similarly, the thickness of the electronic component 150 may also be increased to match the thickness of the core structure 110, and vice versa. Since other contents are substantially the same as those described above, detailed descriptions thereof will be omitted.

Figure 20:
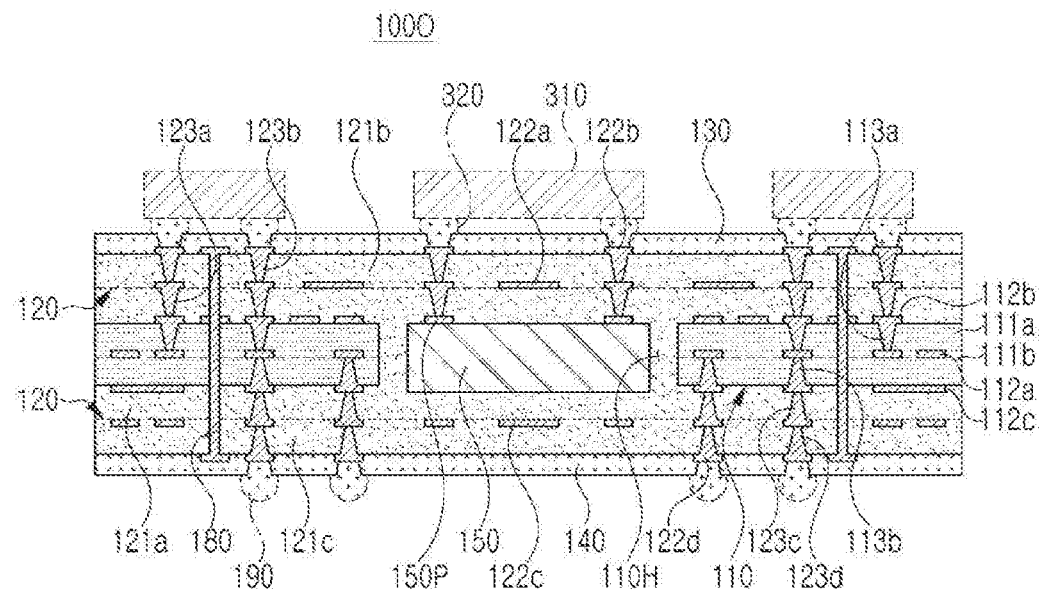
FIG. 20 is a cross-sectional view schematically illustrating a modified example of the printed circuit board of FIG. 18.

FIG. 20 is a cross-sectional view schematically illustrating a modified example of the printed circuit board of FIG. 18.

Referring to FIG. 20, a printed circuit board 100O according to a modified example further includes a through-via 180 in the printed circuit board 100M according to another example described above. The through-via 180 may penetrate through at least two insulating layers of the first and second core insulating layers 111a and 111b and the first to third build-up insulating layers 121a, 121b and 121c. The through-via 180 may be connected to at least two wiring layers of the first to third core wiring layers 112a, 112b and 112c and the first to fourth build-up wiring layers 122a, 122b, 122c and 122d. The through-via 180 may directly penetrate through at least one of the first to third core wiring layers 112a, 112b and 112c and the first and third build-up wiring layers 122a and 122c. Since other contents are substantially the same as those described above, detailed descriptions thereof will be omitted.

Figure 21:
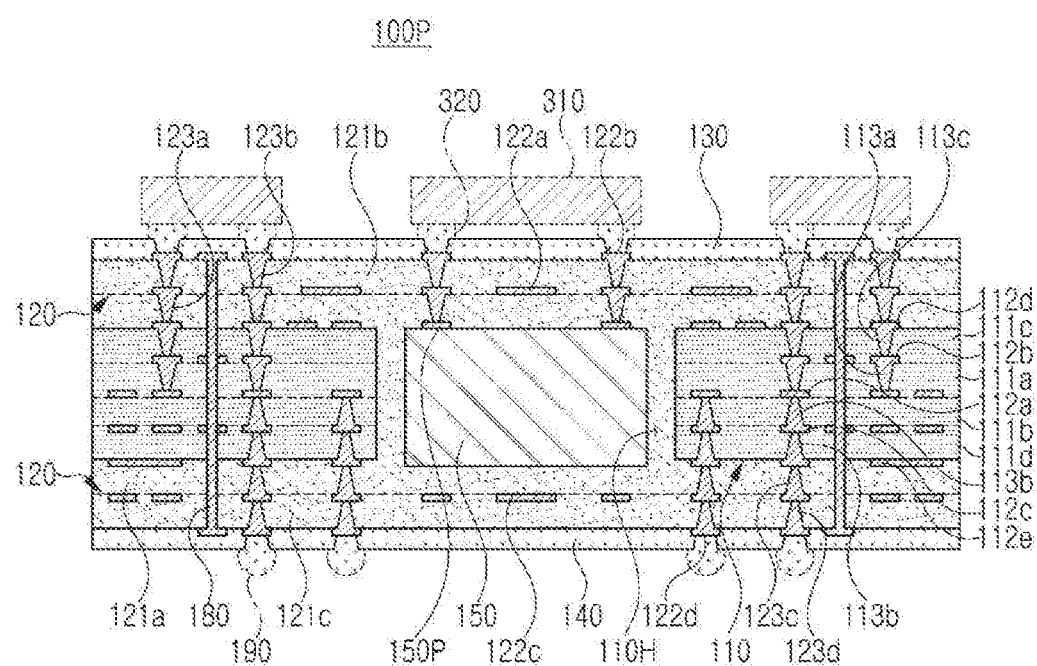
FIG. 21 is a cross-sectional view schematically illustrating a modified example of the printed circuit board of FIG. 18.

FIG. 21 is a cross-sectional view schematically illustrating a modified example of the printed circuit board of FIG. 18.

Referring to FIG. 21, a printed circuit board 100P according to a modified example includes a core structure 110 that is a coreless substrate and has a relatively larger number of layers in the printed circuit board 100M according to another example described above. For example, the core structure 110 may further include a third core insulating layer 111c disposed on an upper surface of the first core insulating layer 111a to cover the second core wiring layer 112b, a fourth core insulating layer 111d disposed on the lower surface of the second core insulating layer 111b to cover the third core wiring layer 112c, a fourth core wiring layer 112d protrudingly disposed on an upper surface of the third core insulating layer 111c, a fifth core wiring layer 112e protrudingly disposed on a lower surface of the fourth core insulating layer 111d, a third core via layer 113c penetrating through the third core insulating layer 111c and connecting the second and fourth core wiring layers 112b and 112d, and a fourth core via layer 113d penetrating through the fourth core insulating layer 111d and connecting the third and fifth core wiring layers 112c and 112e. The core structure 110 may further include a through-via 180. Since other contents are substantially the same as those described above, detailed descriptions thereof will be omitted.

Figure 22A:
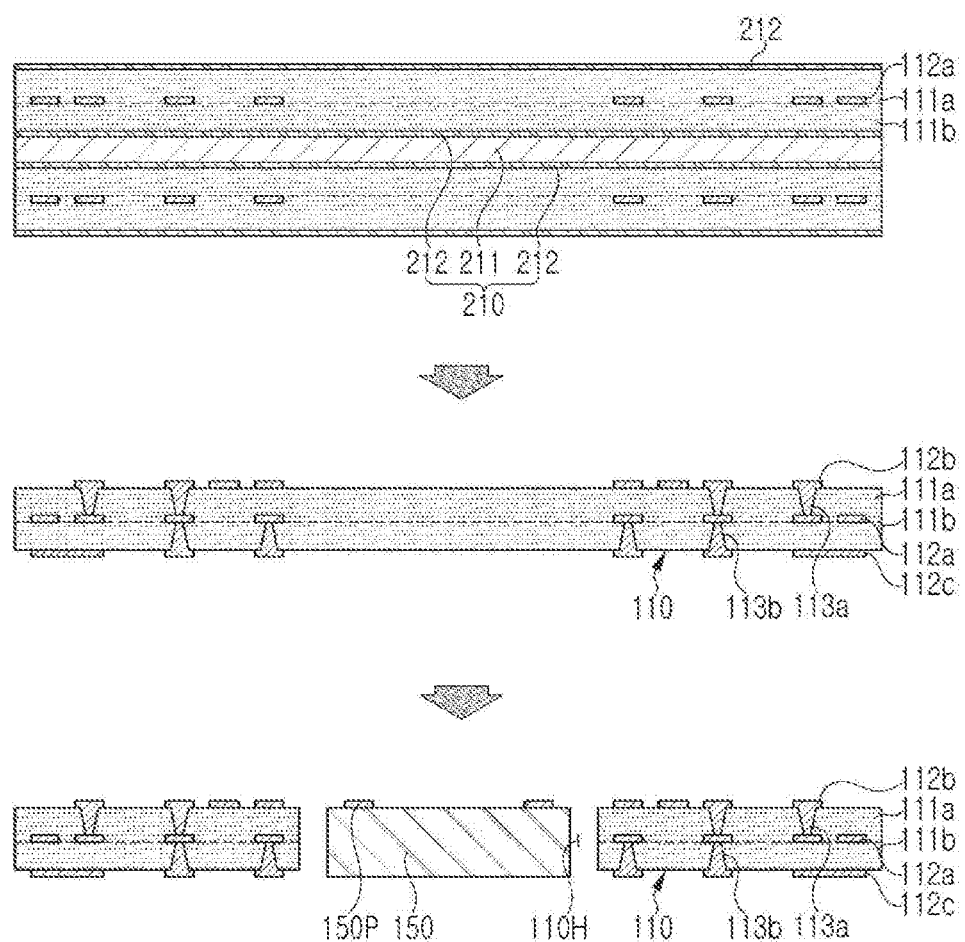
FIGS. 22A and 22B are process diagrams schematically illustrating an example process of manufacturing the printed circuit board of FIG. 18.
Figure 22B:
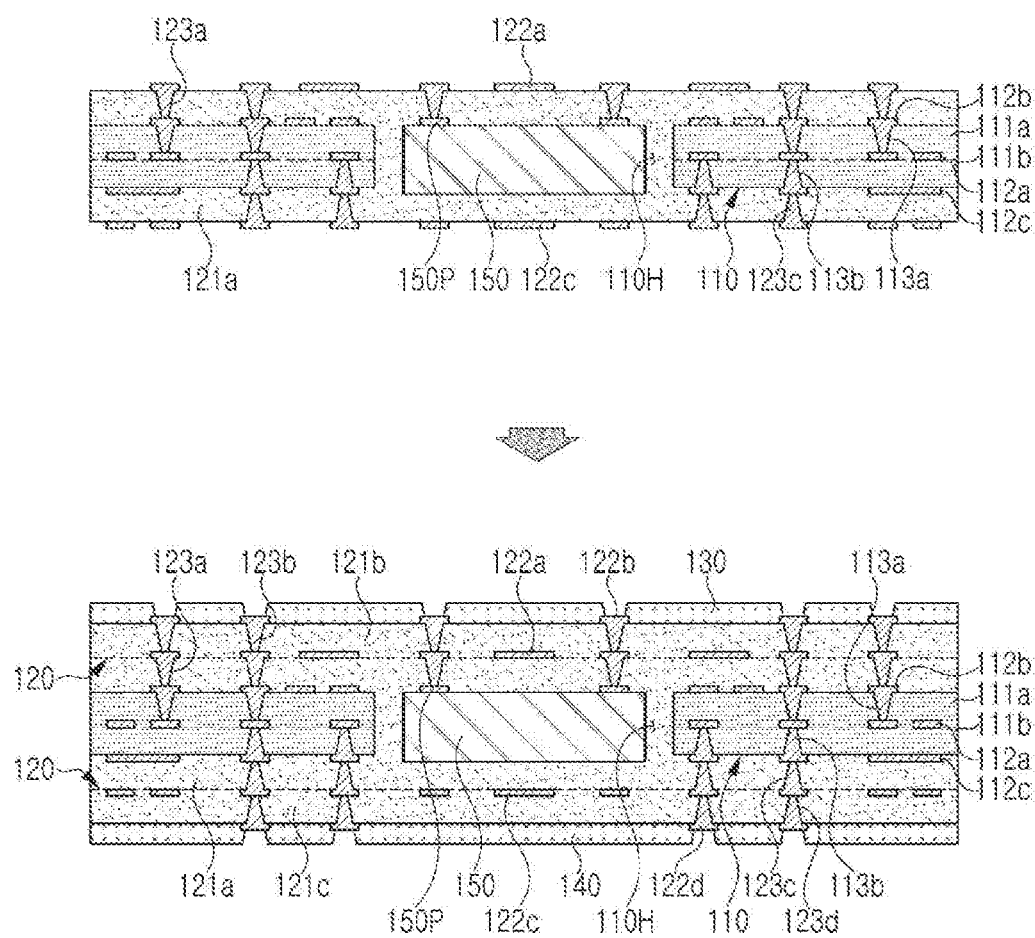

FIGS. 22A and 22B are process diagrams schematically illustrating an example of manufacturing the printed circuit board of FIG. 18.

Referring to FIGS. 22A and 22B, first, a detach carrier substrate 210 including a core layer 211 and metal foils 212 disposed on both surfaces of the core layer 211 is prepared. Thereafter, a second core insulating layer 111b is formed on the substrate 210 by prepreg lamination and curing, and a first core wiring layer 112a is formed on the second core insulating layer 111b by a plating process. Thereafter, a first core insulating layer 111a may be formed by prepreg lamination and curing on the second core insulating layer 111b, and the metal foil 212 may be disposed on the first core insulating layer 111a.

Next, a formed laminate is separated from the core layer 211 of the substrate 210. At this time, the metal foil 212 may remain in the laminate. Thereafter, via holes are formed in the first and second core insulating layers 111a and 111b. Thereafter, second and third core wiring layers 112b and 112c and first and second core via layers 113a and 113b are formed by the plating process using the metal foils 212 and 222, thereby forming the core structure 110. On the other hand, in the case of simply building up a multilayer on the substrate 210 in a coreless form, since a process is performed in a relatively thick substrate state, a problem of yield risk may occur, and the substrate 210 may be repeatedly chemically damaged in a repeated lamination process, thereby causing liquid permeation through a separated interface. On the other hand, in another example, only an appropriate number of layers are configured on the substrate 210, a laminate is separated, and then, the core structure 110 is formed in a subsequent process, thereby preventing the occurrence of the above-described problems. In addition, both-sided lamination may be performed with a relatively small amount of layers, and thus, it may be advantageous in terms of reducing warpage in process.

Next, a through-portion 110H penetrating through the first and second core insulating layers 111a and 111b is formed in the core structure 110 by using a laser drill and/or a mechanical drill. Thereafter, the electronic component 150 is disposed in the through-portion 110H using a tape or the like. On the other hand, in the case of simply building up a multilayer in a coreless form on the substrate 210, forming the through-portion 110H for embedding the electronic component 150 therein may be difficult. On the other hand, in an example, only a desired number of layers are configured on the substrate 210 to form a laminate, and the laminate is separated, and then, the core structure 110 is formed in a subsequent process. Then, after the through-portion 110H is formed in the core structure 110, the electronic component 150 may be disposed, which may also be advantageous in that the electronic component 150 is embedded. The electronic component 150 may be disposed in a face-up form such that the connection electrode 150P faces upwards, but an example thereof is not limited thereto. In contrast, the electronic component 150 may be disposed in a face-down form.

Next, the first build-up insulating layer 121a is formed by ABF lamination and curing on both sides of the core structure 110. The first build-up insulating layer 121a may fill the through-portion 110H in this process, in such a manner that the electronic component 150 may be embedded in this process. Thereafter, via holes are formed in the first build-up insulating layer 121a using a laser drill or the like, and the first and third build-up wiring layers 122a and 122c and the first and third build-up via layers 123a and 123c are formed by a plating process.

Next, the second and third build-up insulating layers 121b and 121c are formed on both sides of the first build-up insulating layer 121a through ABF double-side lamination and curing. Thereafter, via-holes are formed in the second and third build-up insulating layers 121b and 121c, respectively, using a laser drill or the like, and the second and fourth build-up wiring layers 122b and 122d and the third and fourth build-up via layers 123b and 123d are formed in the plating process. Thereafter, first and second passivation layers 130 and 140 are formed on the first and second build-up insulating layers 121b and 121c through ABF lamination and curing, respectively, as appropriate.

If desired, an electrical connection metal bump 190 may be further formed, and an electronic component 310 may be further disposed in the form of a surface mount through a connection member 320. Through a series of processes, the printed circuit board 100M according to the example may be manufactured.

Figure 23:
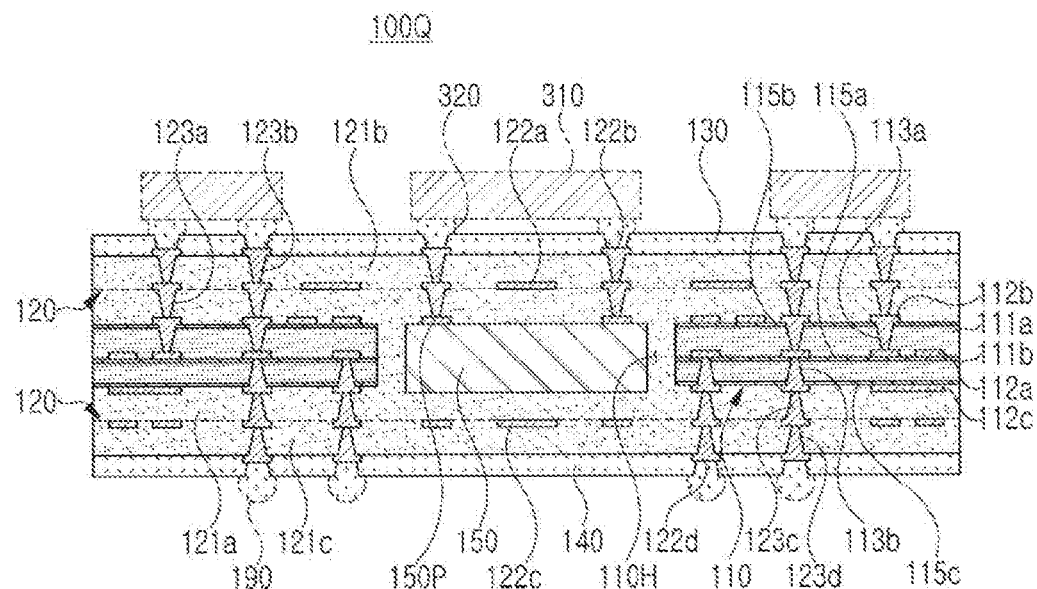
FIG. 23 is a schematic cross-sectional view illustrating another example of a printed circuit board.

FIG. 23 is a schematic cross-sectional view illustrating another example of a printed circuit board.

Referring to FIG. 23, a printed circuit board 100Q according to another example is configured in such a manner that a core structure 110 further includes first to third primer layers 115a, 115b and 115c. The first primer layer 115a is disposed on the upper surface of the second core insulating layer 111b. The first primer layer 115a may be disposed between the first core insulating layer 111a and the second core insulating layer 111b and between the second core insulating layer 111b and the first core wiring layer 112a. The second primer layer 115b is disposed on the upper surface of the first core insulating layer 111a. The second primer layer 115b may be disposed between the first core insulating layer 111a and the first build-up insulating layer 121a and between the first core insulating layer 111a and the second core wiring layer 112b. The third primer layer 115c is disposed on the lower surface of the second core insulating layer 111b. The third primer layer 115c may be disposed between the second core insulating layer 111b and the first build-up insulating layer 121a and between the second core insulating layer 111b and the third core wiring layer 112c.

On the other hand, a through-portion 110H may also penetrate through the first to third primer layers 115a, 115b and 115c. The first core via layer 113A may also penetrate through the second primer layer 115b. In addition, the second core via layers 113a and 113b may also penetrate through the second and third primer layers 115b and 115c. The first to third primer layers 115a, 115b and 115c may be insulating layers including an insulating resin. In this case, the insulating resin may be, for example, acrylic resin, acrylic urethane resin, epoxy resin, or combinations thereof, but is not limited thereto. In the case of the first to third primer layers 115a, 115b and 115c, roughness may be easily formed, and thus the plating adhesion may be relatively higher than that of the prepreg.

On the other hand, when prepreg is used as the material of the first and second core insulating layers 111a and 111b, performing the SAP plating process may be difficult due to a plating adhesion problem. On the other hand, when the first to third primer layers 115a, 115b and 115c are introduced as in the other example, in the case in which the first to third core wiring layers 112a, 112b and 112c and the first and second core via layers 113a and 113b are formed, the SAP plating process may be utilized easily, as described later. Therefore, the microcircuit pattern may be easily implemented. Since other contents are substantially the same as those described above, detailed descriptions thereof will be omitted.

Figure 24:
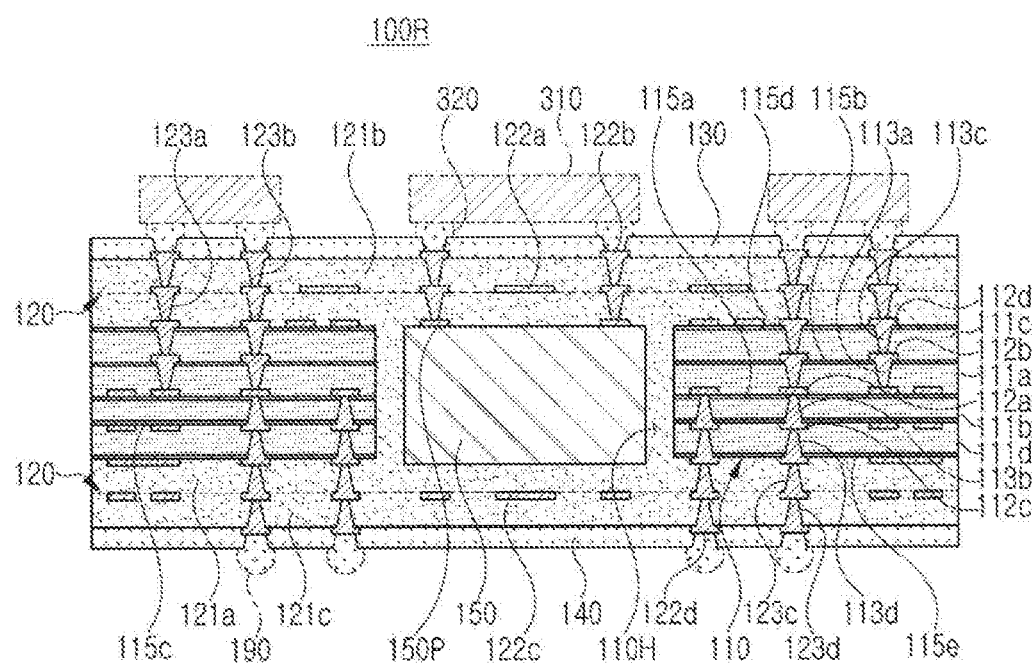
FIG. 24 is a cross-sectional view schematically illustrating a modified example of the printed circuit board of FIG. 23.

FIG. 24 is a cross-sectional view schematically illustrating a modified example of the printed circuit board of FIG. 23.

Referring to FIG. 24, a printed circuit board 100R according to a modified example is configured in such a manner that a core structure 110 is comprised of a relatively larger number of layers as compared with the printed circuit board 100Q according to another example described above. For example, the core structure 110 may further include a third core insulating layer 111c disposed on an upper surface of the first core insulating layer 111a to cover the second core wiring layer 112b, a fourth core insulating layer 111d disposed on the lower surface of the second core insulating layer 111b to cover the third core wiring layer 112c, a fourth core wiring layer 112d protrudingly disposed on an upper surface of the third core insulating layer 111c, a fifth core wiring layer 112e protrudingly disposed on a lower surface of the fourth core insulating layer 111d, a third core via layer 113c penetrating through the third core insulating layer 111c and connecting the second and fourth core wiring layers 112b and 112d, and a fourth core via layer 113d penetrating through the fourth core insulating layer 111d and connecting the third and fifth core wiring layers 112c and 112e. In addition, the core structure 110 may further include fourth and fifth primer layers 115d and 115e. The fourth primer layer 115d may be disposed on the upper surface of the third core insulating layer 111c. The fourth primer layer 115d may be disposed between the third core insulating layer 111c and the first build-up insulating layer 121a and between the third core insulating layer 111c and the fourth core wiring layer 112d. The fifth primer layer 115e may be disposed on the lower surface of the fourth core insulating layer 111d. The fifth primer layer 115e may be disposed between the fourth core insulating layer 111d and the first build-up insulating layer 121a and between the fourth core insulating layer 111d and the fifth core wiring layer 112e. The through-portion 110H may also penetrate through the fourth and fifth primer layers 115d and 115e. The third core via layer 113c may also penetrate through the fourth primer layer 115d. The fourth core via layer 113d may also penetrate through the fifth primer layer 115e. Since other contents are substantially the same as those described above, detailed descriptions thereof will be omitted.

Figure 25:
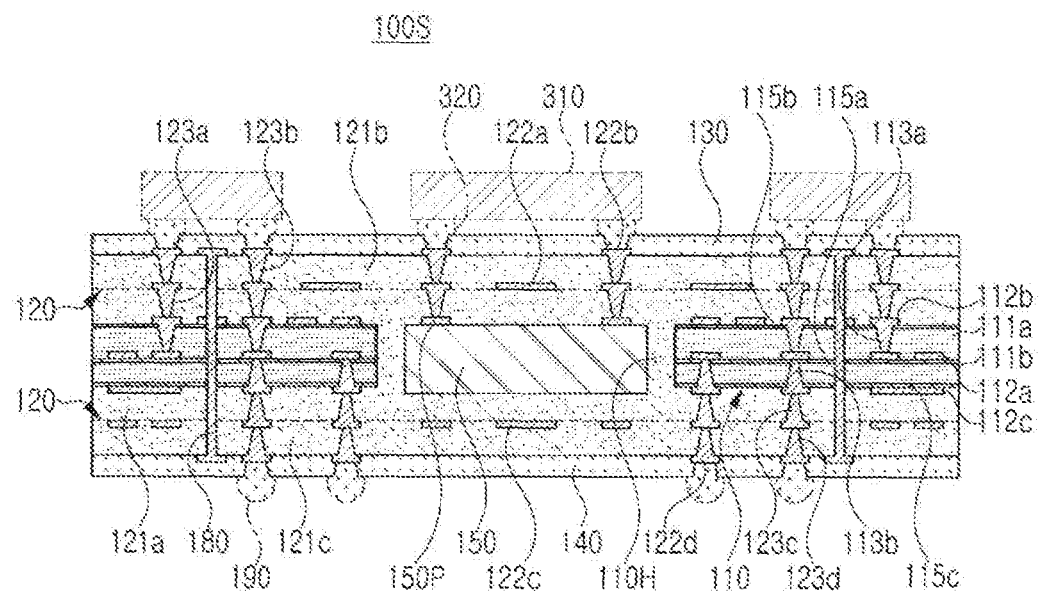
FIG. 25 is a cross-sectional view schematically illustrating a modified example of the printed circuit board of FIG. 23.

FIG. 25 is a cross-sectional view schematically illustrating a modified example of the printed circuit board of FIG. 23.

Referring to FIG. 25, a printed circuit board 100S according to a modified example further includes a through-via 180 in the printed circuit board 100Q according to another example described above. The through-via 180 may penetrate through at least two insulating layers among the first and second core insulating layers 111a and 111b and the first to fourth build-up insulating layers 121a, 121b and 121c. In addition, the through-via 180 may penetrate through at least two primer layers of the first and second primer layers 115a and 115b. The through-via 180 may be connected to at least two wiring layers of the first to third core wiring layers 112a, 112b and 112c and the first to fourth build-up wiring layers 122a, 122b, 122c and 122d. The through-via 180 may directly penetrate through at least one of the first to third core wiring layers 112a, 112b and 112c and the first and third build-up wiring layers 122a and 122c. Since other contents are substantially the same as those described above, detailed descriptions thereof will be omitted.

Figure 26:
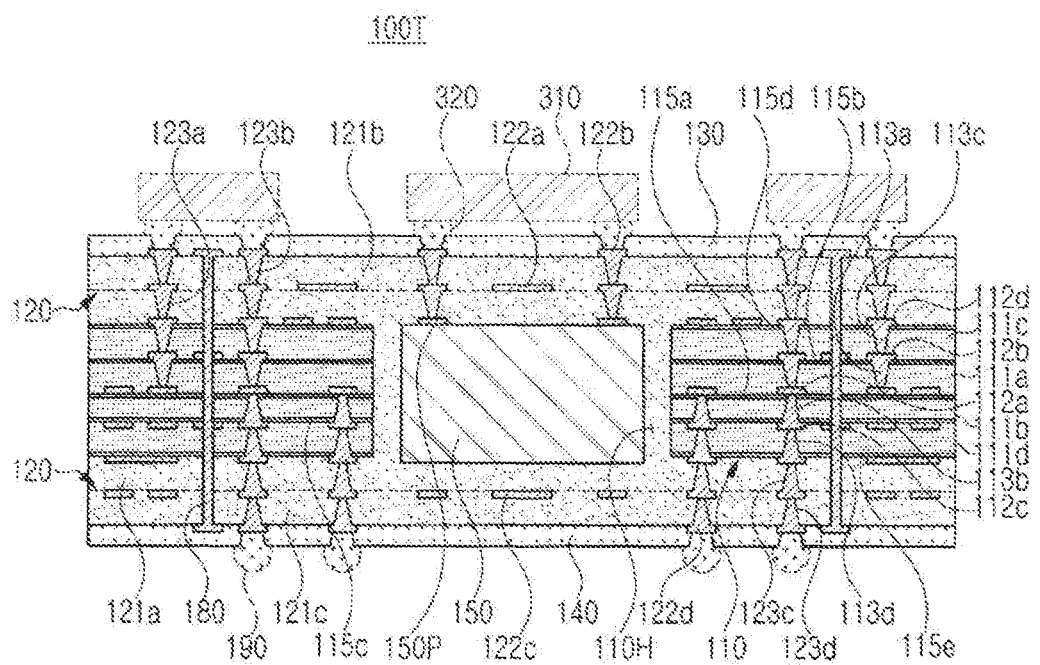
FIG. 26 is a cross-sectional view schematically illustrating a modified example of the printed circuit board of FIG. 23.

FIG. 26 is a cross-sectional view schematically illustrating a modified example of the printed circuit board of FIG. 23.

Referring to FIG. 26, a printed circuit board 100T according to a modified example is configured in such a manner that a core structure 110 is a coreless substrate and has a relatively larger number of layers, compared to the printed circuit board 100Q according to another example described above. For example, the core structure 110 may further include a third core insulating layer 111c disposed on an upper surface of the first core insulating layer 111a to cover the second core wiring layer 112b, a fourth core insulating layer 111d disposed on the lower surface of the second core insulating layer 111b to cover the third core wiring layer 112c, a fourth core wiring layer 112d protrudingly disposed on an upper surface of the third core insulating layer 111c, a fifth core wiring layer 112e protrudingly disposed on a lower surface of the fourth core insulating layer 111d, a third core via layer 113c penetrating through the third core insulating layer 111c and connecting the second and fourth core wiring layers 112b and 112d, and a fourth core via layer 113d penetrating through the fourth core insulating layer 111d and connecting the third and fifth core wiring layers 112c and 112e. In addition, the core structure 110 may further include fourth and fifth primer layers 115d and 115e. The core structure 110 may further include a through-via 180. Since other contents are substantially the same as those described above, detailed descriptions thereof will be omitted.

Figure 27A:
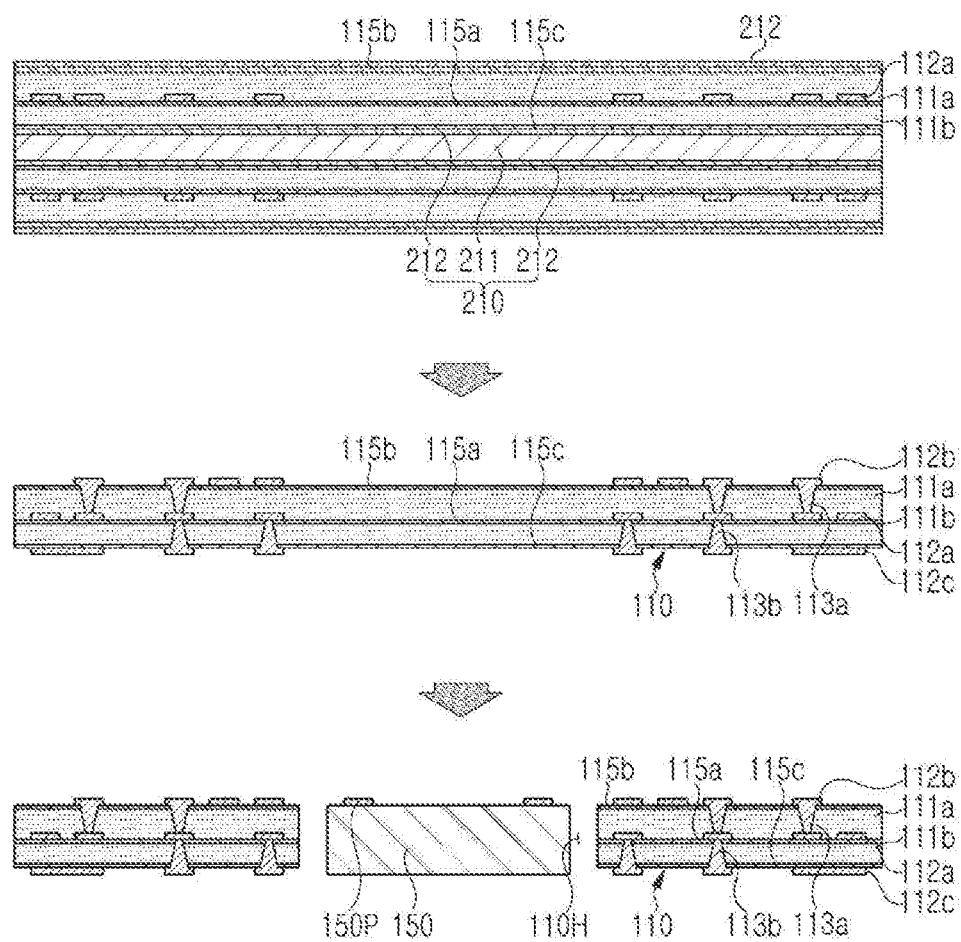
FIGS. 27A and 27B are process diagrams schematically illustrating an example process of manufacturing the printed circuit board of FIG. 23.
Figure 27B:
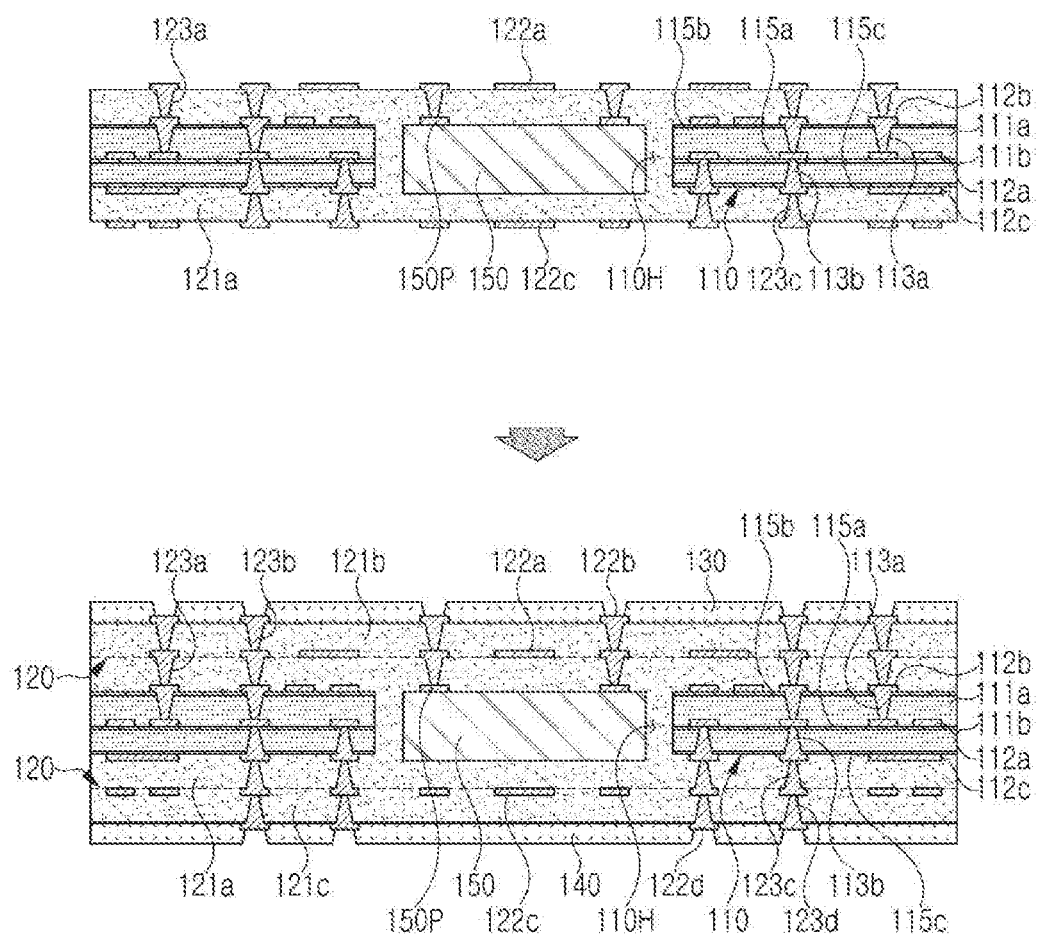

FIGS. 27A and 27B are process diagrams schematically illustrating an example of manufacturing the printed circuit board of FIG. 23.

Referring to FIGS. 27A and 27B, first, a detach carrier substrate 210 including a core layer 211 and metal foils 212 disposed on both surfaces of the core layer 211 is prepared. Thereafter, the second core insulating layer 111b is formed by prepreg lamination and curing on the substrate 210, and the first primer layer 115a is formed on the second core insulating layer 111b by coating or laminating. In this case, a material in which the primer layer is formed on the prepreg may also be used. Thereafter, the first core wiring layer 112a is formed on the second core insulating layer 111b by an SAP plating process or the like. Thereafter, the first core insulating layer 111a is formed by prepreg lamination and curing on the second core insulating layer 111b, and the second primer layer 115b is formed on the second core insulating layer 111b by coating or laminating. In this case, a material in which the primer layer is formed on the prepreg may also be used. The metal foil 212 may be disposed on the second primer layer 115b. On the other hand, before forming the second core insulating layer 111b, the third primer layer 115c may be introduced on the substrate 210, for example, on the metal foil 212, and in this case, the SAP plating process may be used for all layers of the core structure 110, thus significantly reducing line and space design constraints. On the other hand, the third primer layer 115c may be omitted, and in this case, the third core wiring layer 112c, which will be described later, should be formed using MSAP, but in the case of designing as power and/or ground, there may not particularly be a problem in the design.

Next, a formed laminate is separated from the core layer 211 of the substrate 210. At this time, the metal foil 212 may remain in the laminate. Thereafter, via holes are formed in the first and second core insulating layers 111a and 111b. Thereafter, the second and third core wiring layers 112b and 112c and the first and second core via layers 113a and 113b are formed by the SAP plating process using the metal foils 212 and 222. Thus, the core structure 110 may be formed. On the other hand, in the case of simply building up the multilayer structure on the substrate 210 in a coreless form, since a process may occur in a relatively thick substrate state, a problem of yield risk may occur, and the substrate 210 may be repeatedly chemically damaged in a repeated lamination process, thereby causing liquid permeation through a separated interface. On the other hand, in another example, only a desired number of layers are configured on the substrate 210, a laminate is separated, and then, the core structure 110 is formed in a subsequent process, thereby preventing the occurrence of the above-described problems. In addition, both-sided lamination may be performed with a relatively small amount of layers, and thus, it may be advantageous in terms of reducing warpage in process.

Next, a through-portion 110H penetrating through the first and second core insulating layers 111a and 111b and the first to third primer layers 115a, 115b and 115c is formed in the core structure 110 by using a laser drill and/or a mechanical drill.

Thereafter, the electronic component 150 is disposed in the through-portion 110H using a tape or the like. On the other hand, in the case of simply building up a multilayer in a coreless form on the substrate 210, forming the through-portion 110H for embedding the electronic component 150 therein may be difficult. On the other hand, in an example, only a desired number of layers are configured on the substrate 210 to forma laminate, and the laminate is separated, and then, the core structure 110 is formed in a subsequent process. Then, after the through-portion 110H is formed in the core structure 110, the electronic component 150 may be disposed, which may also be advantageous in that the electronic component 150 is embedded. The electronic component 150 may be disposed in a face-up form such that the connection electrode 150P faces upwards, but an example thereof is not limited thereto. In contrast, the electronic component 150 may be disposed in a face-down form.

Next, the first build-up insulating layer 121a is formed by performing ABF lamination and curing on both sides of the core structure 110. The first build-up insulating layer 121a may fill the through-portion 110H in this process, in such a manner that the electronic component 150 may be embedded in this process.

Thereafter, via holes are formed in the first build-up insulating layer 121a using a laser drill or the like, and the first and third build-up wiring layers 122a and 122c and the first and third build-up via layers 123a and 123c are formed by a plating process.

Next, second and third build-up insulating layers 121b and 121c are formed on both sides of the first build-up insulating layer 121a through ABF double-side lamination and curing. Thereafter, via holes are formed in the second and third build-up insulating layers 121b and 121c, respectively, by a laser drill or the like, and the second and fourth build-up wiring layers 122b and 122d and the second and fourth build-up via layers 123b and 123d are formed are formed by a plating process. Thereafter, the first and second passivation layers 130 and 140 are formed on the first and second build-up insulating layers 121b and 121c through ABF lamination and curing, respectively, as appropriate.

If desired, an electrical connection metal bump 190 may be further formed, and an electronic component 310 may be further disposed in the form of a surface mount through the connection member 320. Through a series of processes, the printed circuit board 100Q according to another example may be manufactured.

Figure 28:
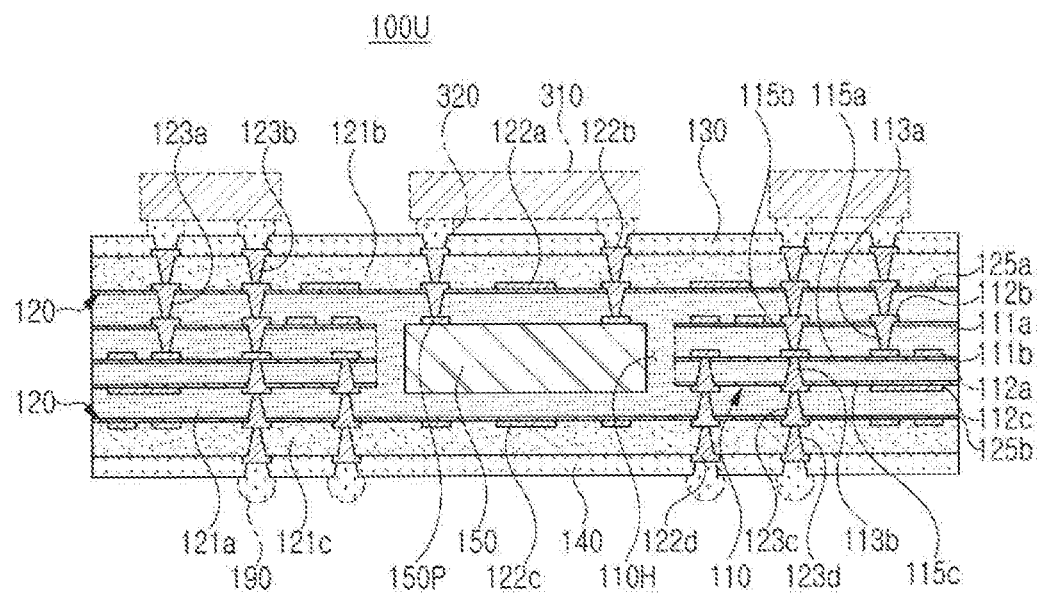
FIG. 28 is a schematic cross-sectional view illustrating another example of a printed circuit board.

FIG. 28 is a schematic cross-sectional view illustrating another example of a printed circuit board.

Referring to FIG. 28, in the case of a printed circuit board 100U according to another example, the first build-up insulating layer 121a includes the same type of material as that of and the first and second core insulating layers 111a and 111b. For example, the first build-up insulating layer 121a may also be formed of a material including an insulating resin, an inorganic filler, and glass fiber, such as a prepreg. The first build-up insulating layer 121a may also have a higher elastic modulus than the second and third build-up insulating layers 121b and 121c. Although the boundary between the first build-up insulating layer 121a and the first and second core insulating layers 111a and 111b may be unclear, an example thereof is not limited thereto, and the boundary may be distinguished even when the same type of material is included. Further, additional rigidity may be provided by using prepreg or the like as the material of the first build-up insulating layer 121a that fills the through-portion 110H and embeds the electronic component 150 therein.

On the other hand, first and second build-up primer layers 125a and 125b may be disposed on the upper and lower surfaces of the first build-up insulating layer 121a. The first build-up primer layer 125a is disposed between the first build-up insulating layer 121a and the second build-up insulating layer 121b, and between the first build-up insulating layer 121a and the first build-up wiring layer 122a. The second build-up primer layer 125b is disposed between the first build-up insulating layer 121a and the third build-up insulating layer 121c and between the first build-up insulating layer 121a and the third build-up wiring layer 122c. The first and third build-up via layers 123a and 123b may also penetrate through the first and second build-up primer layers 125a and 125b, respectively. The first and second build-up primer layers 125a and 125b may be insulating layers including an insulating resin. In this case, the insulating resin may be an acrylic resin, an acrylic urethane resin, an epoxy resin, or combinations thereof, but is not limited thereto. In the case of the first and second build-up primer layers 125a and 125b, roughness may be easily formed, so that the plating adhesion may be relatively higher than that of the prepreg.

On the other hand, when the prepreg is used as the material of the first build-up insulating layer 121a, performing the SAP plating process may be difficult due to the plating adhesion problem. On the other hand, when the first and second build-up primer layers 125a and 125b are introduced as in another example, the first and third build-up wiring layers 122a and 122c and the first and third build-up via layers 123a and 123c are formed, the SAP plating process may be utilized easily, as described later. Thereby, the microcircuit pattern may be easily implemented.

On the other hand, the second and third build-up insulating layers 121b and 121c are each multilayered, and at least one thereof may also be a material including an insulating resin, an inorganic filler, and glass fiber, such as a prepreg. Thereby, the rigidity may be further added. In this case, the build-up primer layer may be further disposed in a desired position. Since other contents are substantially the same as those described above, detailed descriptions thereof will be omitted.

Figure 29:
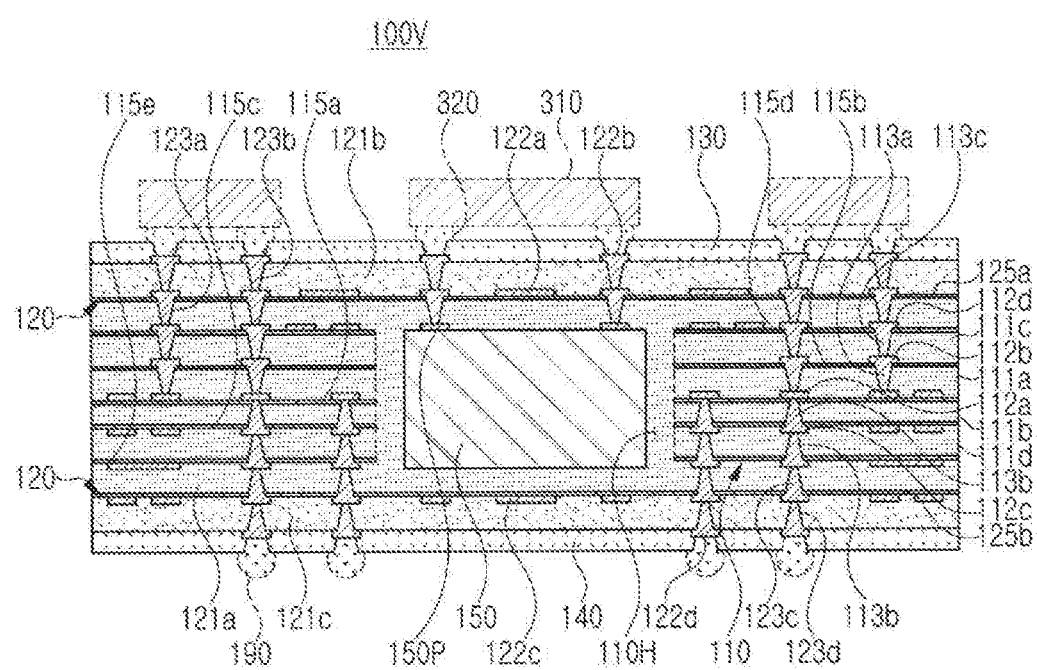
FIG. 29 is a cross-sectional view schematically illustrating a modified example of the printed circuit board of FIG. 28.

FIG. 29 is a cross-sectional view schematically illustrating a modified example of the printed circuit board of FIG. 28.

Referring to FIG. 29, a printed circuit board 100V according to a modified example is configured in such a manner that a core structure 110 has a relatively larger number of layers as compared with the printed circuit board 100U according to another example described above. For example, the core structure 110 may further include a third core insulating layer 111c disposed on an upper surface of the first core insulating layer 111a to cover the second core wiring layer 112b, a fourth core insulating layer 111d disposed on the lower surface of the second core insulating layer 111b to cover the third core wiring layer 112c, a fourth core wiring layer 112d disposed on an upper surface of the third core insulating layer 111c, a fifth core wiring layer 112e disposed on a lower surface of the fourth core insulating layer 111d, a third core via layer 113c penetrating through the third core insulating layer 111c and connecting the second and fourth core wiring layers 112b and 112d, and a fourth core via layer 113d penetrating through the fourth core insulating layer 111d and connecting the third and fifth core wiring layers 112c and 112e. In addition, the core structure 110 may further include fourth and fifth primer layers 115d and 115e. The fourth primer layer 115d may be disposed on the upper surface of the third core insulating layer 111c. The fourth primer layer 115d may be disposed between the third core insulating layer 111c and the first build-up insulating layer 121a and between the third core insulating layer 111c and the fourth core wiring layer 112d. The fifth primer layer 115e may be disposed on the lower surface of the fourth core insulating layer 111d. The fifth primer layer 115e may be disposed between the fourth core insulating layer 111d and the first build-up insulating layer 121a and between the fourth core insulating layer 111d and the fifth core wiring layer 112e. The through-portion 110H may also penetrate through the fourth and fifth primer layers 115d and 115e. The third core via layer 113c may also penetrate through the fourth primer layer 115d. The fourth core via layer 113d may also penetrate through the fifth primer layer 115e. Since other contents are substantially the same as those described above, detailed descriptions thereof will be omitted.

Figure 30:
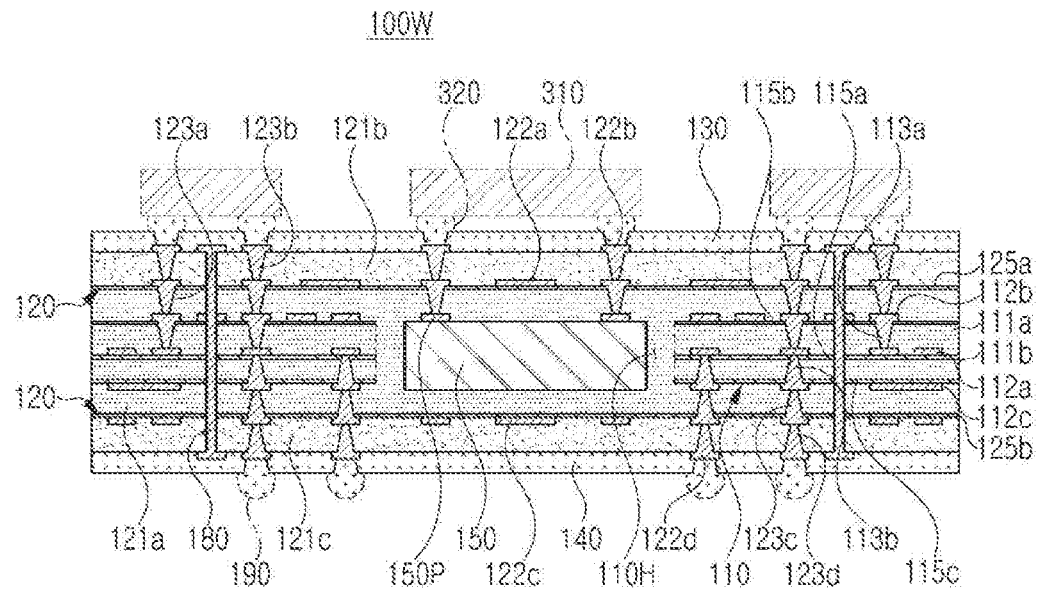
FIG. 30 is a cross-sectional view schematically illustrating a modified example of the printed circuit board of FIG. 28.

FIG. 30 is a schematic cross-sectional view illustrating a modified example of the printed circuit board of FIG. 28.

Referring to FIG. 30, a printed circuit board 100W according to a modified example further includes a through-via 180 in the printed circuit board 100U according to another example described above. The through-via 180 may penetrate through at least two insulating layers among the first and second core insulating layers 111a and 111b and the first to fourth build-up insulating layers 121a, 121b and 121c. In addition, the through-via 180 may penetrate through at least two primer layers among the first and second primer layers 115a and 115b and the first and second build-up primer layers 125a and 125b. The through-via 180 may be connected to at least two wiring layers among the first to third core wiring layers 112a, 112b and 112c and the first to fourth build-up wiring layers 122a, 122b, 122c and 122d. The through-via 180 may directly penetrate through at least one of the first to third core wiring layers 112a, 112b and 112c and the first and third build-up wiring layers 122a and 122c. Since other contents are substantially the same as those described above, detailed descriptions thereof will be omitted.

Figure 31:
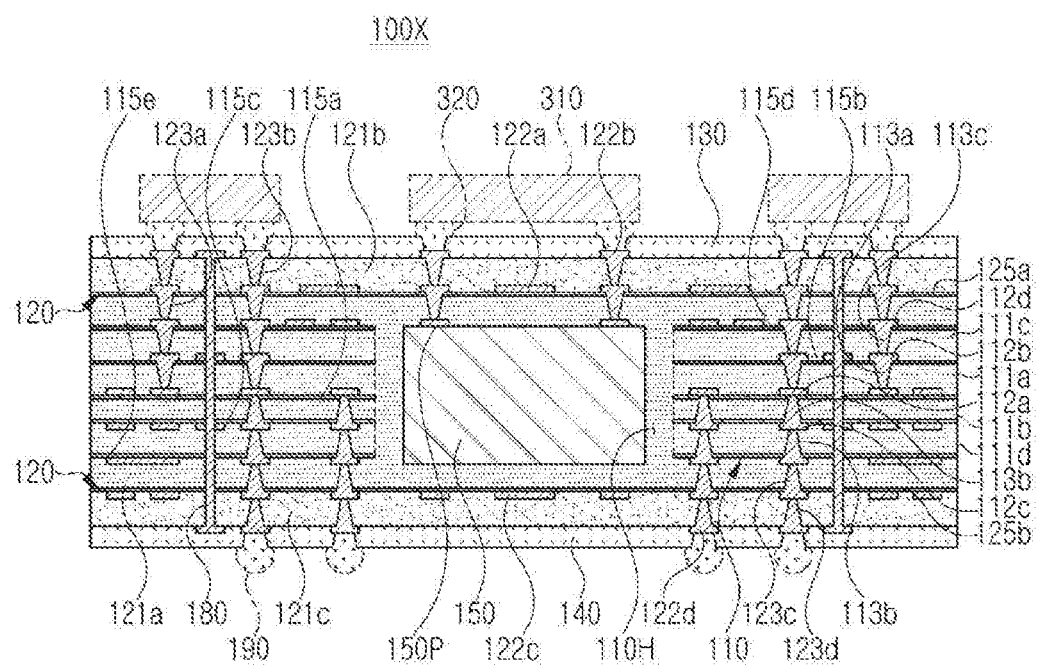
FIG. 31 is a cross-sectional view schematically illustrating a modified example of the printed circuit board of FIG. 28.

FIG. 31 is a schematic cross-sectional view illustrating a modified example of the printed circuit board of FIG. 28.

Referring to FIG. 31, a printed circuit board 100X according to a modified example is configured in such a manner that a core structure 110 is a coreless substrate and has a relatively larger number of layers, compared to the printed circuit board 100U according to another example described above. For example, the core structure 110 may further include a third core insulating layer 111c disposed on an upper surface of the first core insulating layer 111a to cover the second core wiring layer 112b, a fourth core insulating layer 111d disposed on the lower surface of the second core insulating layer 111b to cover the third core wiring layer 112c, a fourth core wiring layer 112d disposed on an upper surface of the third core insulating layer 111c, a fifth core wiring layer 112e disposed on a lower surface of the fourth core insulating layer 111d, a third core via layer 113c penetrating through the third core insulating layer 111c and connecting the second and fourth core wiring layers 112b and 112d, and a fourth core via layer 113d penetrating through the fourth core insulating layer 111d and connecting the third and fifth core wiring layers 112c and 112e. In addition, the core structure 110 may further include fourth and fifth primer layers 115d and 115e. The core structure 110 may further include a through-via 180. Since other contents are substantially the same as those described above, detailed descriptions thereof will be omitted.

Figure 32A:
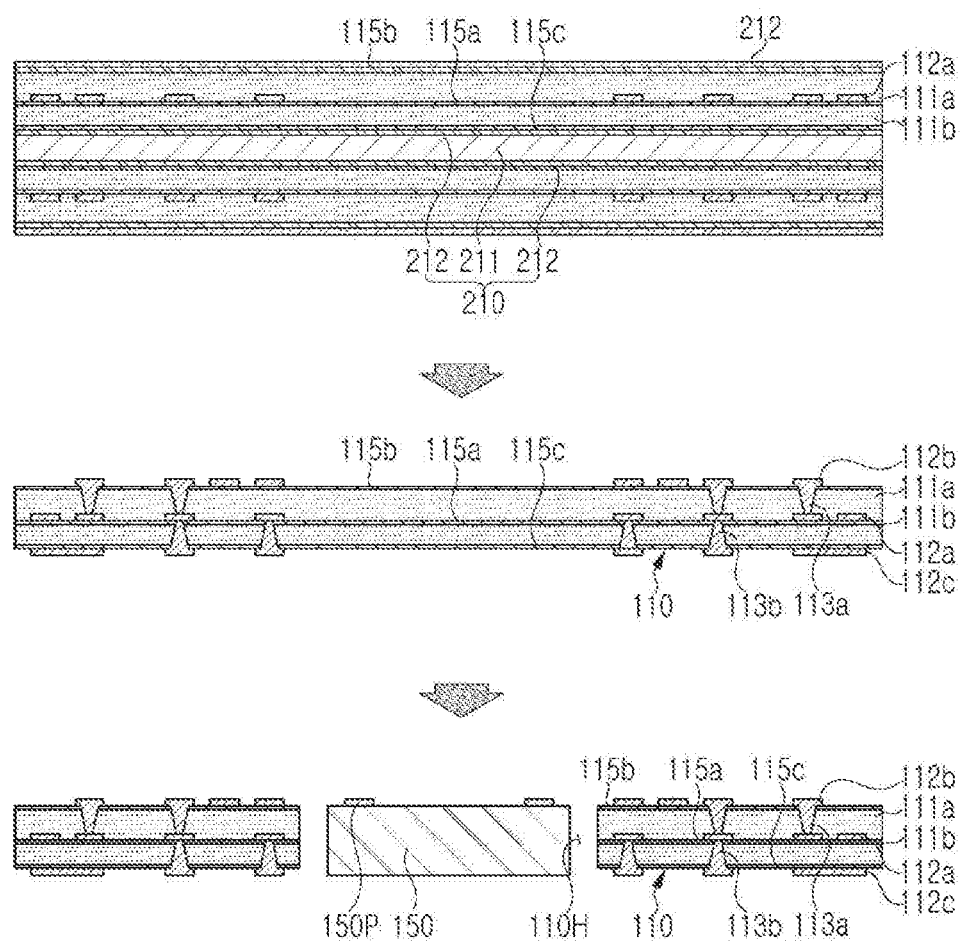
FIGS. 32A and 32B are process diagrams schematically illustrating an example process of manufacturing the printed circuit board of FIG. 28.
Figure 32B:
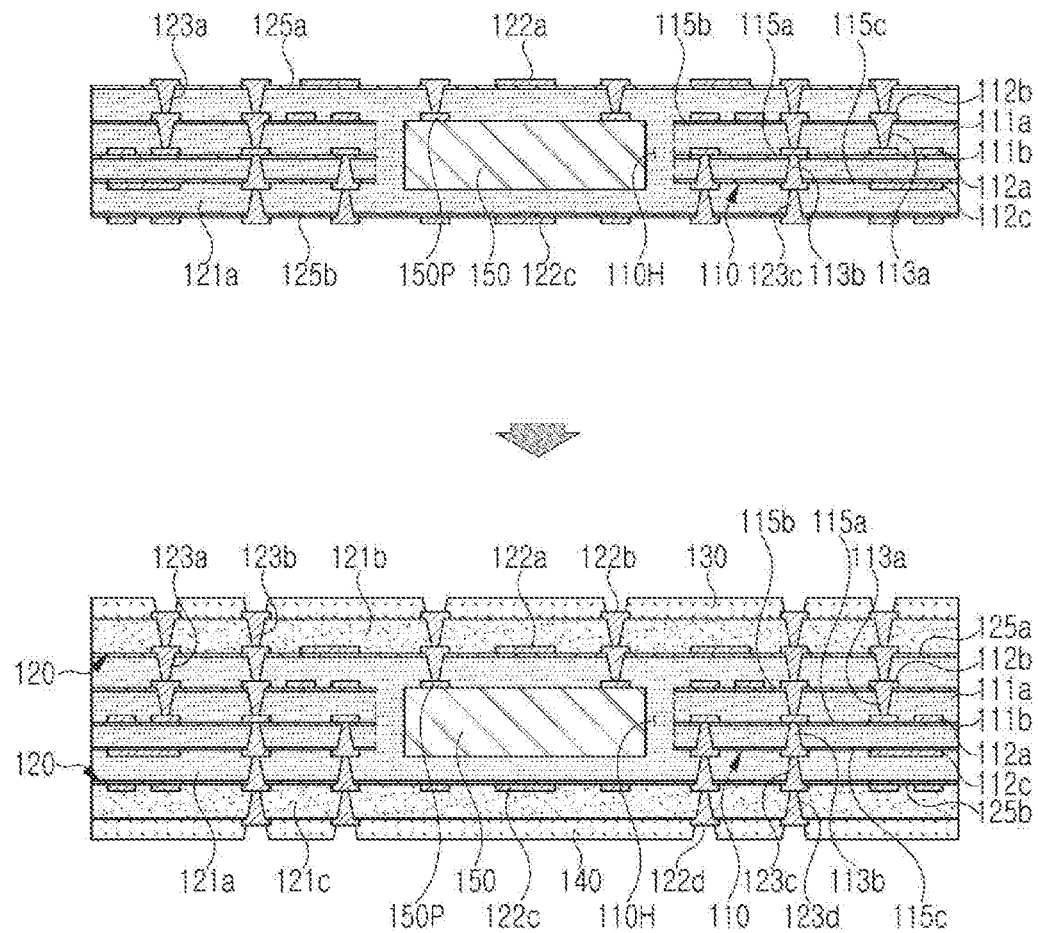

FIGS. 32A and 32B are process diagrams schematically illustrating an example of manufacturing the printed circuit board of FIG. 28.

Referring to FIGS. 32A and 32B, first, a detach carrier substrate 210 including a core layer 211 and metal foils 212 disposed on both surfaces of the core layer 211 is prepared. Thereafter, the second core insulating layer 111b is formed by prepreg lamination and curing on the substrate 210, and the first primer layer 115a is formed on the second core insulating layer 111b by coating or laminating. In this case, a material in which the primer layer is formed on the prepreg may also be used. Thereafter, the first core wiring layer 112a is formed on the second core insulating layer 111b by an SAP plating process or the like. Thereafter, the first core insulating layer 111a is formed on the second core insulating layer 111b by prepreg lamination and curing, and the second primer layer 115b is formed on the second core insulating layer 111b by coating or laminating. In this case, a material in which the primer layer is formed on the prepreg may also be used. The metal foil 222 may be disposed on the second primer layer 115b. On the other hand, before forming the second core insulating layer 111b, the third primer layer 115c may be introduced on the substrate 210, for example, on the metal foil 212, and in this case, the SAP plating process may be used for all layers of the core structure 110, thus significantly reducing line and space design constraints. On the other hand, the third primer layer 115c may be omitted, and in this case, the third core wiring layer 112c, which will be described later, should be formed using MSAP, but in the case of designing as power and/or ground, there may not particularly be a problem in the design.

Next, a formed laminate is separated from the core layer 211 of the substrate 210. At this time, the metal foil 212 may remain in the laminate. Thereafter, via holes are formed in the first and second core insulating layers 111a and 111b. Thereafter, the second and third core wiring layers 112b and 112c and the first and second core via layers 113a and 113b are formed using the SAP plating process, by using the metal foils 212 and 222 as seed layers. Thus, the core structure 110 may be formed. On the other hand, in the case of simply building up the multilayer structure on the substrate 210 in a coreless form, since a process may occur in a relatively thick substrate state, a problem of yield risk may occur, and the substrate 210 may be repeatedly chemically damaged in a repeated lamination process, thereby causing liquid permeation through a separated interface. On the other hand, in another example, only a desired number of layers are configured on the substrate 210, a laminate is separated, and then, the core structure 110 is formed in a subsequent process, thereby preventing the occurrence of the above-described problems. In addition, both-sided lamination may be performed with a relatively small amount of layers, and thus, it may be advantageous in terms of reducing warpage in process.

Next, a through-portion 110H penetrating through the first and second core insulating layers 111a and 111b and the first to third primer layers 115a, 115b and 115c is formed in the core structure 110 by using a laser drill and/or a mechanical drill. Thereafter, the electronic component 150 is disposed in the through-portion 110H using a tape or the like. On the other hand, in the case of simply building up a multilayer in a coreless form on the substrate 210, forming the through-portion 110H for embedding the electronic component 150 therein may be difficult. On the other hand, in an example, only a desired number of layers are configured on the substrate 210 to forma laminate, and the laminate is separated, and then, the core structure 110 is formed in a subsequent process. Then, after the through-portion 110H is formed in the core structure 110, the electronic component 150 may be disposed, which may also be advantageous in that the electronic component 150 is embedded. The electronic component 150 may be disposed in a face-up form such that the connection electrode 150P faces upwards, but an example thereof is not limited thereto. In contrast, the electronic component 150 may be disposed in a face-down form.

Next, the first build-up insulating layer 121a is formed by performing prepreg lamination and curing on both sides of the core structure 110. In addition, the first and second build-up primer layers 125a and 125b are formed on both surfaces of the first build-up insulating layer 121a by coating or laminating. In this case, a material in which the primer layer is formed on the prepreg may also be used. The first build-up insulating layer 121a may fill the through-portion 110H in this process, in such a manner that the electronic component 150 may be embedded in this process.

Thereafter, via holes are formed in the first build-up insulating layer 121a and the first and second build-up primer layers 125a and 125b by using a laser drill or the like, and the first and third build-up wiring layers 122a and 122c and the first and third build-up via layers 123a and 123c are formed by an SAP plating process or the like.

Next, the second and third build-up insulating layers 121b and 121c are formed on both sides of the first build-up insulating layer 121a through ABF double-side lamination and curing. Thereafter, via holes are formed in the second and third build-up insulating layers 121b and 121c, respectively, by a laser drill or the like, and the third and fourth build-up wiring layers 122c and 122d and the third and fourth build-up via layers 123c and 123d are formed by plating processes such as AP, SAP, MSAP, TT or the like. Since the second and third build-up insulating layers 121b and 121c may be ABF layers, the SAP plating process may be easily performed without the primer layer. Thereafter, the first and second passivation layers 130 and 140 are formed on the first and second build-up insulating layers 121b and 121c through ABF lamination and curing, respectively, as appropriate.

If desired, an electrical connection metal bump 190 may be further formed, and an electronic component 310 may be further disposed in the form of a surface mount through a connection member 320. Through a series of processes, the printed circuit board 100U according to the example may be manufactured.

As set forth above, as a portion of various effects according to examples, a printed circuit board able to have a relatively thin thickness and high wiring density, and reducing a warpage problem, may be provided.

In addition, a printed circuit board having an electronic component easily embedded therein may be provided.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board comprising:
   a coreless substrate including an insulating body and a plurality of core wiring layers disposed on or within the insulating body, the coreless substrate having a through-opening penetrating through the insulating body;
   an electronic component disposed in the through-opening;
   a first build-up insulating layer covering at least a portion of two opposing surfaces of the coreless substrate, allowing at least a portion of the electronic component to be embedded in the first build-up insulating layer, and filling at least a portion of the through-opening;

a first build-up wiring layer disposed on an upper surface of the first build-up insulating layer;
a second build-up insulating layer disposed on the upper surface of the first build-up insulating layer and covering at least a portion of the first build-up wiring layer;
a second build-up wiring layer disposed on an upper surface of the second build-up insulating layer; and
one or more primer layers disposed within the insulating body,
wherein the insulating body includes a different type of material from a material of the second build-up insulating layer, and
wherein at least one of an upper surface or a lower surface of the insulating body is provided with a primer layer further disposed thereon.

2. The printed circuit board of claim 1, wherein the insulating body has a higher elastic modulus than the second build-up insulating layer.

3. The printed circuit board of claim 1, further comprising:
a third build-up wiring layer disposed on a lower surface of the first build-up insulating layer;
a third build-up insulating layer disposed on a lower surface of the first build-up insulating layer and covering at least a portion of the third build-up wiring layer; and
a fourth build-up wiring layer disposed on a lower surface of the third build-up insulating layer,
wherein the insulating body comprises a different type of material from a material of the third build-up insulating layer.

4. The printed circuit board of claim 3, wherein the insulating body comprises a same type of material as a material of the first build-up insulating layer, and
the second and third build-up insulating layers comprise a same type of material.

5. The printed circuit board of claim 4, wherein the insulating body has a higher elastic modulus than each of the second build-up insulating layer and the third build-up insulating layer, and the first build-up insulating layer comprises an elastic modulus higher than an elastic modulus of each of the second build-up insulating layer and the third build-up insulating layer.

6. The printed circuit board of claim 3, wherein the coreless substrate comprises a first core insulating layer, a first core wiring layer embedded in the first core insulating layer in such a manner that an upper surface of the first core wiring layer is exposed through an upper surface of the first core insulating layer, a second core wiring layer disposed to protrude from a lower surface of the first core insulating layer, a second core insulating layer disposed on a lower surface of the first core insulating layer and covering at least a portion of the second core wiring layer, and a third core wiring layer disposed to protrude from a lower surface of the second core insulating layer,
the insulating body comprises the first and second core insulating layers, and
the plurality of core wiring layers comprises the first to third core wiring layers.

7. The printed circuit board of claim 6, wherein the coreless substrate further comprises a first core via layer penetrating through the first core insulating layer and connecting the first and second core wiring layers, and a second core via layer penetrating through the second core insulating layer and connecting the second and third core wiring layers,
wherein the first and second core via layers have profiles tapered in a same direction.

8. The printed circuit board of claim 7, further comprising:
a first build-up via layer penetrating through the first build-up insulating layer and connecting the first build-up wiring layer to the first core wiring layer;
a second build-up via layer penetrating through the second build-up insulating layer and connecting the second build-up wiring layer to the first build-up wiring layer;
a third build-up via layer penetrating through the first build-up insulating layer and connecting the third build-up wiring layer to the third core wiring layer; and
a fourth build-up via layer penetrating through the third build-up insulating layer and connecting the fourth build-up wiring layer to the third build-up wiring layer,
wherein the first and second build-up via layers have a profile tapered in a direction opposite to the first and second core via layers, and the third and fourth build-up via layers have a profile tapered in the same direction as the first and second core via layers.

9. The printed circuit board of claim 1, wherein upper and lower surfaces of the first build-up insulating layer are provided with a primer layer further disposed thereon, respectively.

* * * * *